(12) United States Patent
Nestler et al.

(10) Patent No.: US 10,469,030 B2
(45) Date of Patent: Nov. 5, 2019

(54) SYSTEMS AND METHODS FOR SYNCHRONOUS DEMODULATION

(71) Applicant: Analog Devices, Inc., Norwood, MA (US)

(72) Inventors: Eric G. Nestler, Long Beach Township, NJ (US); Christopher Lynn Magruder, Boston, MA (US); John Brian Harrington, Revere, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/575,312

(22) PCT Filed: May 20, 2016

(86) PCT No.: PCT/US2016/033653
§ 371 (c)(1),
(2) Date: Nov. 17, 2017

(87) PCT Pub. No.: WO2016/187597
PCT Pub. Date: Nov. 24, 2016

(65) Prior Publication Data
US 2018/0159473 A1 Jun. 7, 2018

Related U.S. Application Data

(60) Provisional application No. 62/164,271, filed on May 20, 2015.

(51) Int. Cl.
*G06G 7/12* (2006.01)
*H03D 7/12* (2006.01)
(Continued)

(52) U.S. Cl.
CPC ............... *H03D 7/12* (2013.01); *H03D 1/22* (2013.01); *H03H 11/04* (2013.01); *H03H 11/34* (2013.01); *H04L 27/22* (2013.01); *H04L 27/233* (2013.01)

(58) Field of Classification Search
None
See application file for complete search history.

(56) References Cited

U.S. PATENT DOCUMENTS 6,608,999 B1    8/2003  Jakobsson
9,484,890 B1 *  11/2016 Cazzaniga ......... G01C 19/5726
(Continued)

FOREIGN PATENT DOCUMENTS

EP    0749055 A2  * 12/1996 ............ H03D 7/161
GB    2026267 A   *  1/1980 ............ H03D 1/2281
WO    2011/020070    2/2011

OTHER PUBLICATIONS

International Search Report and Written Opinion issued in International Patent Application Serial No. PCT/US2016/033653 dated Aug. 24, 2016, 12 pages.

*Primary Examiner* — Lincoln D Donovan
*Assistant Examiner* — Khareem E Almo
(74) *Attorney, Agent, or Firm* — Patent Capital Group

(57) ABSTRACT

Systems and methods for synchronous demodulation using passive sampled analog filtering are disclosed. A system for synchronous demodulation includes an input channel for accepting an input signal, a first passive sampled analog filter for filtering the input signal, a mixer for mixing the filtered input signal and outputting a mixed signal, a second passive sampled analog filter for filtering the mixed signal, and an output channel for outputting the filtered mixed signal.

20 Claims, 38 Drawing Sheets

(51) Int. Cl.
*H03D 1/22* (2006.01)
*H04L 27/22* (2006.01)
*H04L 27/233* (2006.01)
*H03H 11/04* (2006.01)
*H03H 11/34* (2006.01)

(56) References Cited

U.S. PATENT DOCUMENTS

| | | |
|---|---|---|
| 2004/0121751 A1 | 6/2004 | Shen |
| 2005/0104654 A1 | 5/2005 | Muhammad et al. |
| 2005/0238123 A1 | 10/2005 | Ranganathan et al. |
| 2008/0157867 A1* | 7/2008 | Krah ................ G06F 3/044 |
| | | 329/304 |

* cited by examiner

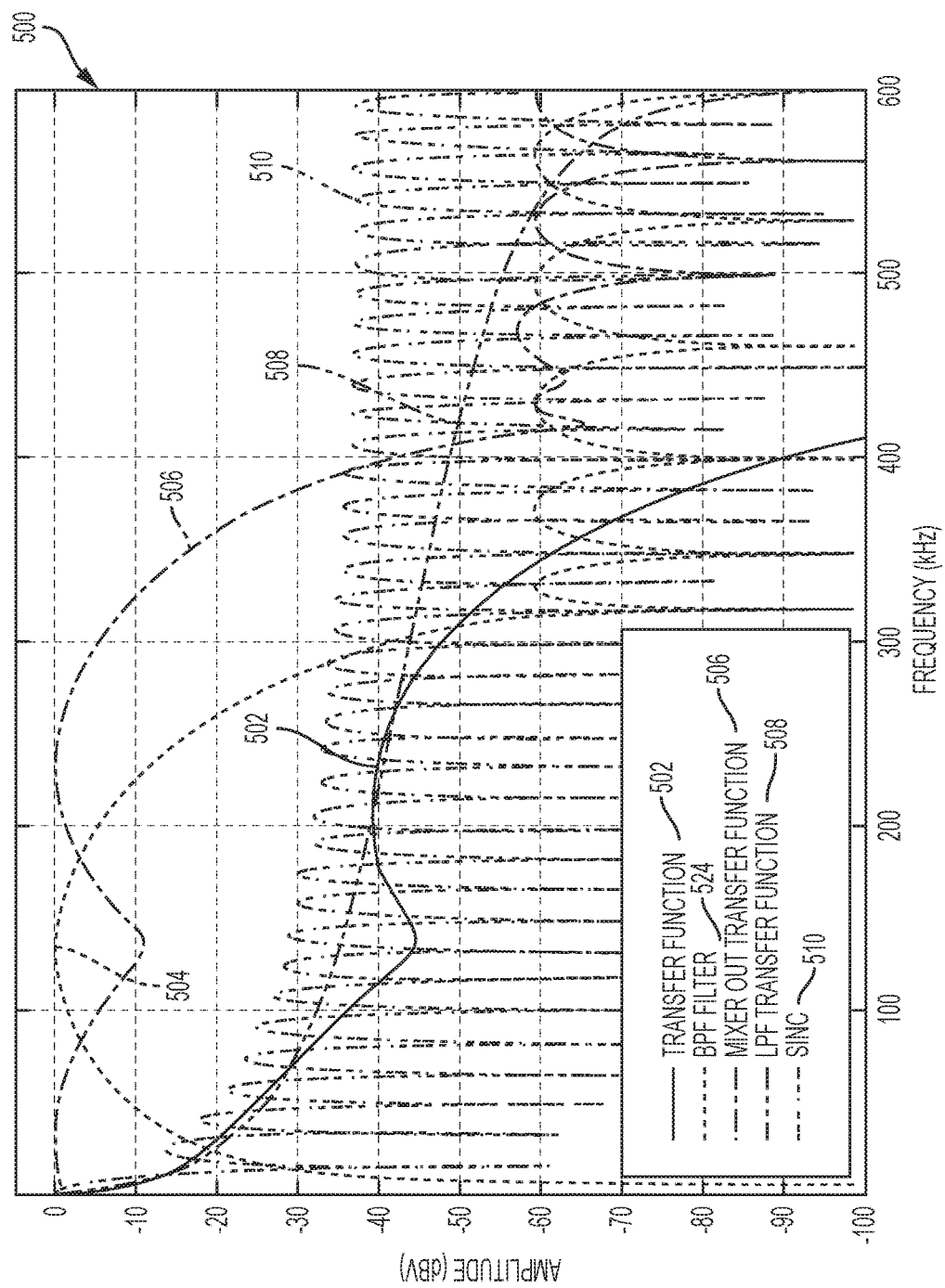

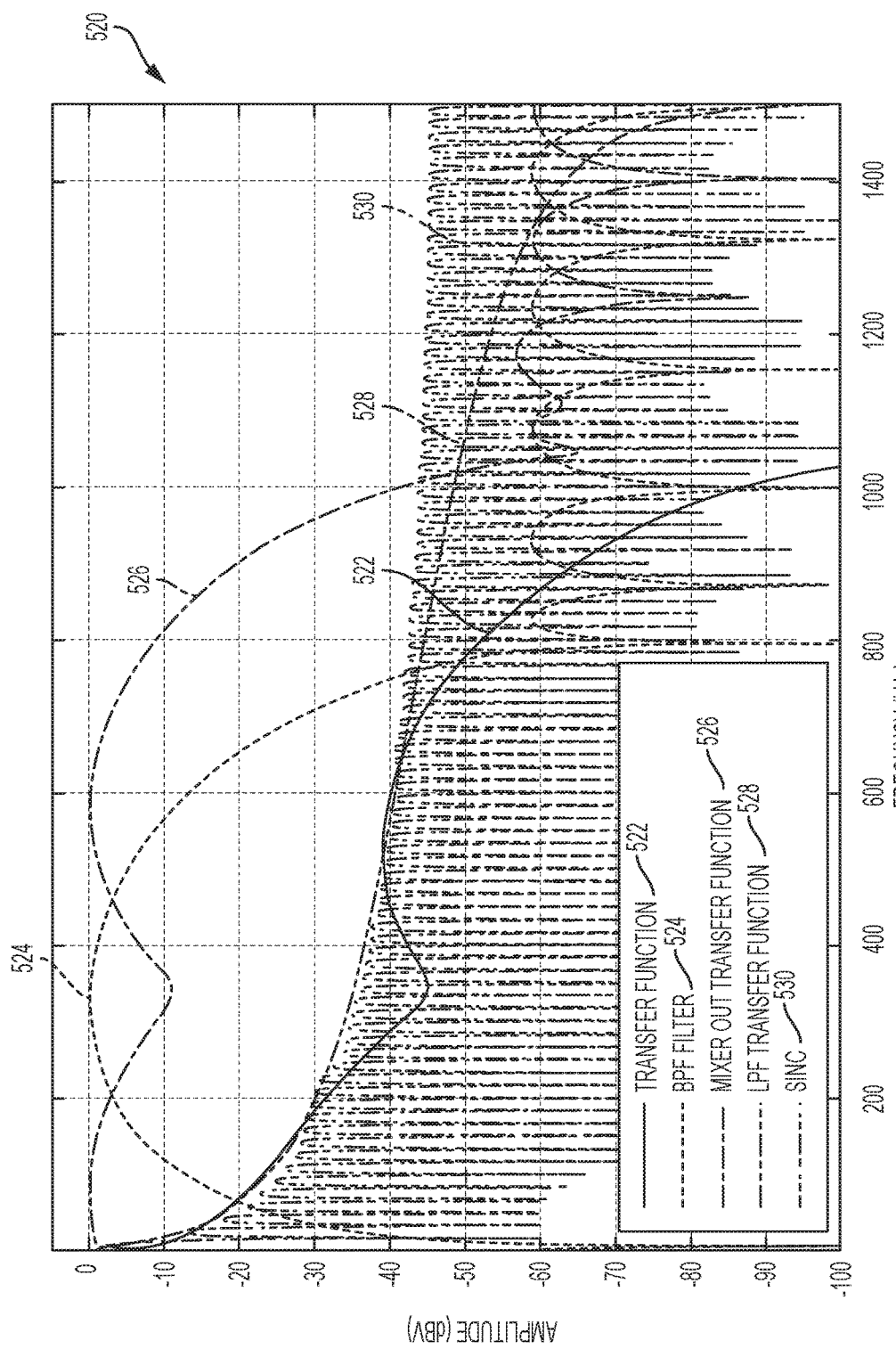

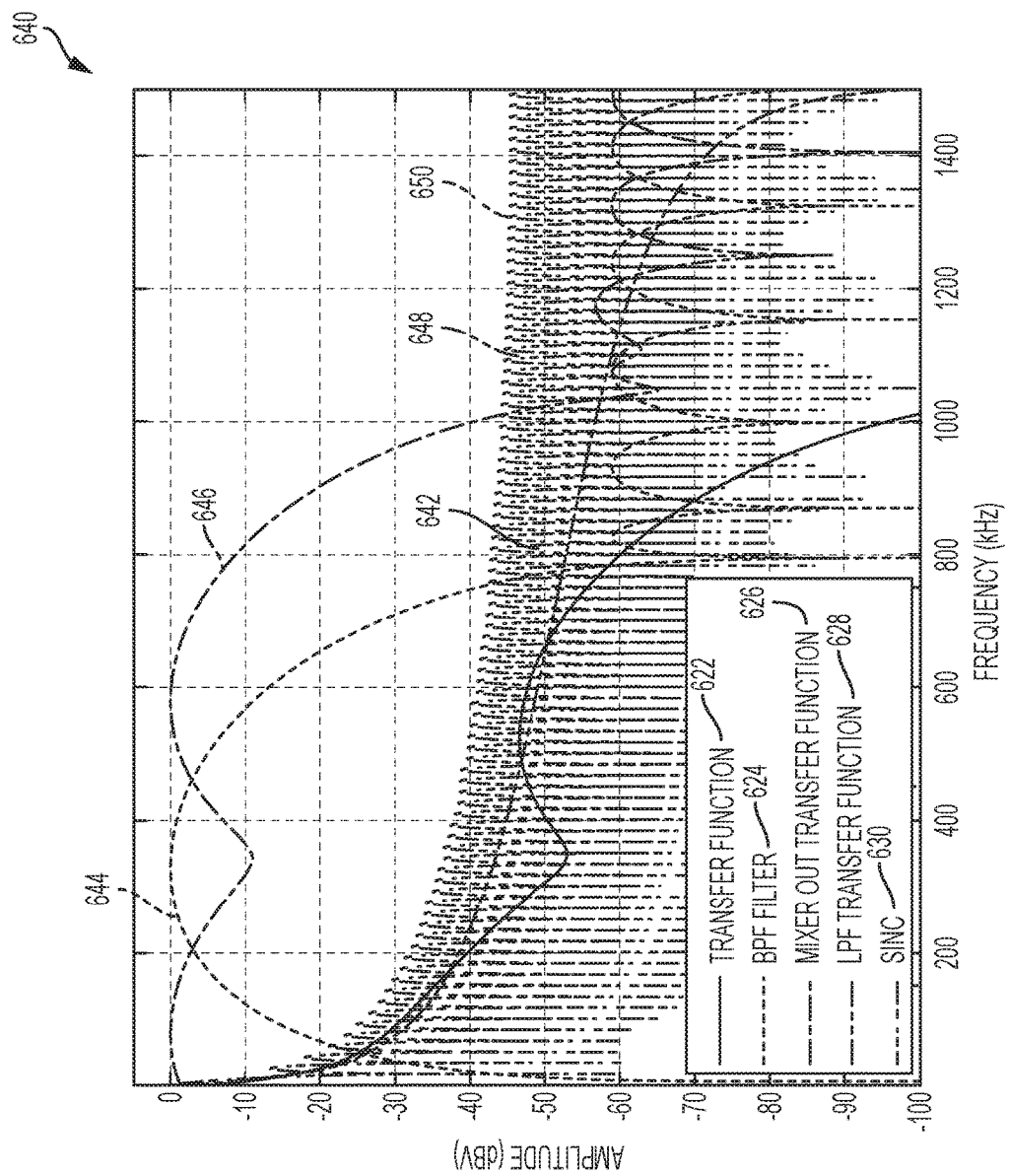

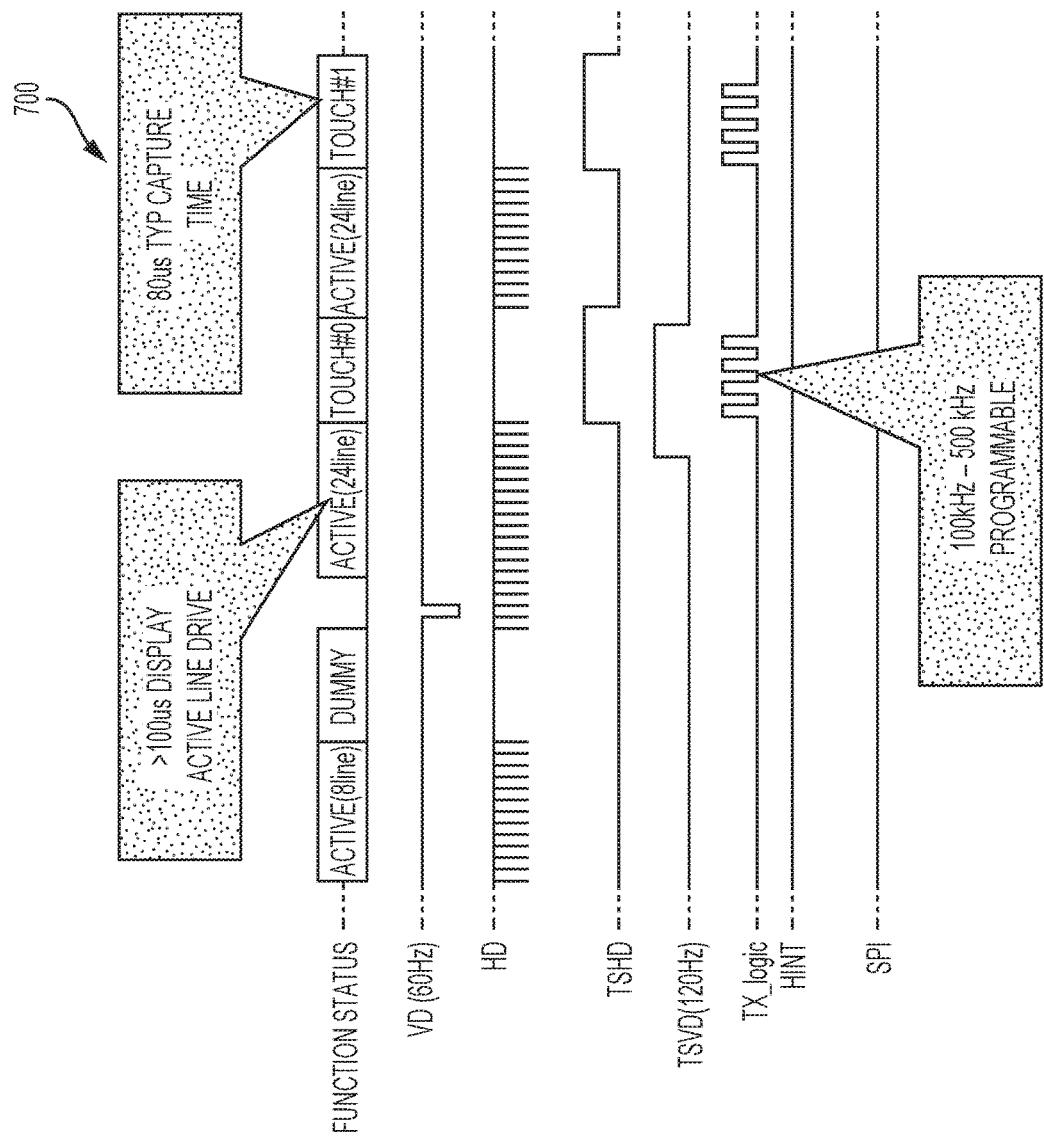

SYSTEMS AND METHODS FOR SYNCHRONOUS DEMODULATION

CROSS-REFERENCE TO RELATED APPLICATION

This Application claims the benefit of priority under 35 U.S.C. § 120 of U.S. Application Ser. No. 62/164,271 filed May 20, 2015, and entitled "Systems and Methods for Synchronous Demodulation", naming Eric Nestler et al., as inventors. The disclosure of the prior Application is considered part of and is incorporated by reference in the disclosure of this Application.

TECHNICAL FIELD OF THE DISCLOSURE

The present invention relates to the field of integrated circuits, in particular to filters.

BACKGROUND

Filtering of analog signals often involves modulation or demodulation to move signals of interest from one frequency to another. An example relates, processing a continuous time signal x(t) to recovery of a signal component with energy in the vicinity of $f_c$ (Hertz) by first bandpass filtering the input signal x(t) retaining signal components in the vicinity of $f_c$ and then modulating the signal with a periodic signal m(t) with a period $1/f_c$. An analog continuous time (CT) filter using opamps is hard to control and not coherent to everything else. The CT filter is an IIR, which adds phase error. An example is shown in Tab A, FIG. 1.

When a bandpass filter is implemented in analog components, the phase and magnitude at the desired center frequency f may be difficult to control. For example, small changes in the actual center frequency of the filter may have relatively large effects on the phase at the desired (as opposed to the actual filter) center frequency. Therefore, even if the modulation frequency for the multiplexor is exactly $f_c$, the unpredictable phase response of the filter may make it difficult to achieve coherent processing.

Modulator blocks are used in a variety of other applications at the input and/or output of analog filter blocks, for example, implemented as analog circuits or implemented using discrete time digitized sample signal processors.

SUMMARY OF THE DISCLOSURE

Systems and methods for synchronous demodulation using passive sampled analog filtering are disclosed. In one aspect, a system includes an input channel for receiving an input signal, a first passive sampled analog filter for filtering the input signal, a mixer for mixing the filtered input signal and outputting a mixed signal, a second passive sampled analog filter for filtering the mixed signal, and an output channel for outputting the filtered mixed signal. In some examples, the first filter and the mixer are combined in a single passive circuit block.

In some implementations, the system includes an active amplifier between the first filter and the mixer for amplifying the filtered signal. In further implementations the system includes another active amplifier between the mixer and the second filter for amplifying the mixed signal.

In some examples, the first passive sampled analog filter is a programmable filter. In other examples, the first passive sampled analog filter is a fixed filter. In some examples, the first passive sampled analog filter is a bandpass filter. In other examples, the first passive sampled analog filter is a lowpass filter. In further examples, the first passive sampled analog, filter is a highpass filter. In other examples, the first passive sampled analog filter can have an arbitrary shape, and it may have any selected shape. In various implementations, the first passive sampled analog filter is one of a finite impulse response (FIR) filter and an infinite impulse response (IIR) filter.

In some examples, the second passive sampled analog filter is a programmable filter. In other examples, the second passive sampled analog filter is a fixed filter. In some examples, the second passive sampled analog filter is a bandpass filter. In other examples the second passive sampled analog filter is a lowpass filter. In further examples, the second passive sampled analog filter is a highpass filter. In other examples, the second passive sampled, analog filter, can have an arbitrary shape, and it may have any selected shape. In various implementations, the second passive sampled analog filter is one of a finite impulse response (FIR) filter and an infinite impulse response (IIR) filter.

In some implementations, the system includes a clock generator for generating an excitation signal. The excitation signal is modified by a target element, and the modified excitation signal is the input signal. In some examples, the target element is a body part and the system measures bioimpedance of the body part. In other examples, the target element is a sensor, a transformer, a differential transformer or another component. In some implementations, the system measures capacitance of the target element. In other implementations the system measures inductance of the target element.

According to some implementations, the system includes a light source for emitting an excitation signal and a light sensor for detecting a modified excitation signal. The light source can be an LED light. In one example, a light source is used for measurements in a liquid, such as blood. In another example, a light source is used for measurements in a gas, such as in a gas meter. In one example, a light source is used for measurement in the air.

According to some implementations, the clock generator generates a reference signal, and the reference signal is mixed with the filtered input signal at the mixer.

According to another aspect, a method for synchronous demodulation using passive sampled analog filtering includes presenting an excitation signal to a target element, receiving, at an input, a modified signal from the target element, filtering, using a passive sampled analog filter, the modified signal to remove noise, mixing the filtered signal with a reference signal from a clock generator, filtering, using a second passive sampled analog filter, the mixed signal, and outputting, from the second passive sampled analog filter, a signal representing characteristics of the target element. According to various examples, outputting the signal includes outputting an I-component of the signal and outputting a Q-component of the signal.

In some examples, presenting the excitation signal includes presenting a current, to the target element, and receiving a modified signal includes receiving a voltage. In other examples, presenting the excitation signal includes presenting a voltage to the target element, and receiving a modified signal includes receiving a current.

According to another aspect, a synchronous demodulation system using passive sampled analog filtering includes, a clock generator for generating an excitation signal an input channel for receiving a modified excitation signal and means for passively filtering and mixing the modified excitation signal to synchronously demodulate the modified excitation signal and generate a demodulated output signal. In one example, the means for passively filtering the modified excitation signal includes a passive sampled analog filter. In some examples, the passive sampled analog filter is one of a low-pass filter, a band-pass filter, and a high-pass filter. In further examples, the passive sampled analog filter can have any selected shape. In some examples, the passive sampled analog filter is one of an FIR and an IIR.

According to various implementations, the means for mixing the modified excitation signal includes a mixer. In some examples, and the mixer is a two-level mixer. In other examples, the mixer is a three-level mixer. In further examples, the mixer has more than three levels.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 5A-5C are diagrams illustrating a typical sampling system trade off between noise bandwidth and a higher sampling frequency for a low pass filter with a fixed filter frequency, according to some embodiments of the disclosure;

FIGS. 6A-6C are diagrams illustrating the decreased noise bandwidth at higher frequencies for an independently programmable low pass filter, according to some embodiments of the disclosure;

FIG. 7 is a diagram illustrating touch panel capture timing, according to some embodiments of the disclosure;

DETAILED DESCRIPTION

Systems and methods for passive sampled analog filtering using synchronous demodulation are disclosed. Synchronous demodulation involves the use of a demodulation signal chosen to frequency translate the signal used to excite the sensor at the frequency of interest, to a desired baseband signal. However, when synchronous demodulation is implemented using discrete time signal processing, a very high ADC sampling rate is needed to avoid additional spurious signal images and alias frequency bands exist which can cause errors in the signal measurement. According to various implementations, systems and methods discussed herein can be used to avoid introducing errors in the signal measurement using substantially lower ADC sampling rates and lower power. For example, using the synchronous demodulation systems and methods described herein an ADC sampling rates can be one thousand times lower than ADC sampling rates for traditional systems.

A passive sampled analog filter uses sampled analog technology to filter an analog signal. In particular, sampled analog technology signal processing is performed in the analog domain by charge sharing among capacitors using only electronic switches and capacitor elements. Thus, a sampled analog filter filters incoming analog signals without first digitizing the signals. Sampled analog technology uses discrete time filter architectures combined with analog signal processing, which eliminates any data path quantization noise issues and analog-to-digital and digital-to-analog conversion steps.

Figure 1A:
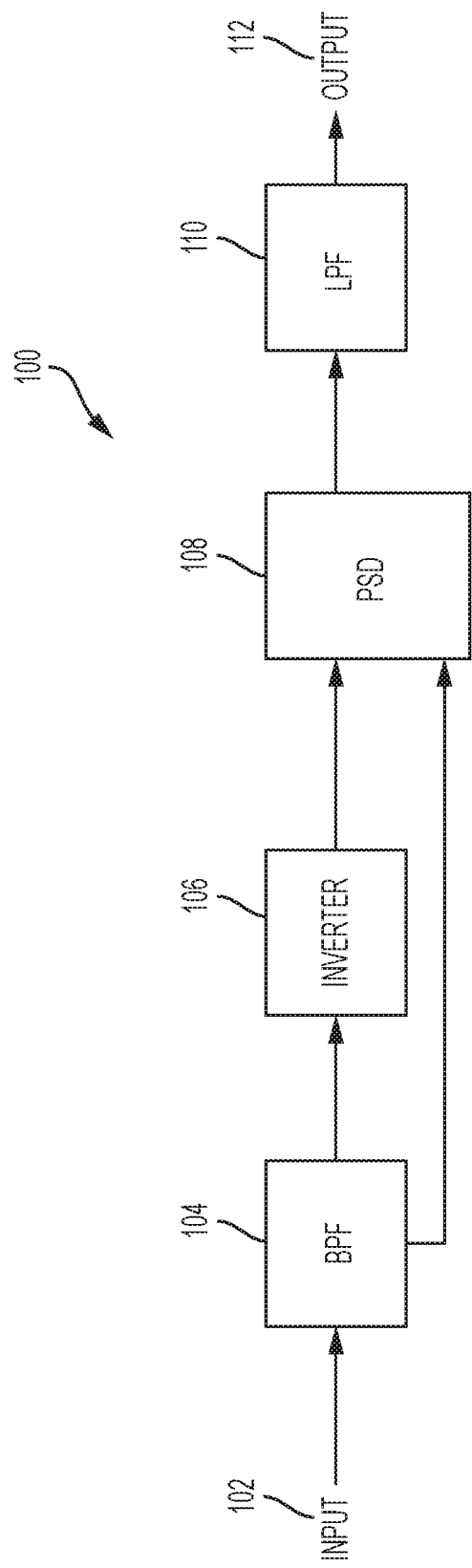
FIGS. 1A and 1B are diagrams illustrating a synchronous demodulator including a continuous time bandpass filter, according to some embodiments of the disclosure.
Figure 1B:
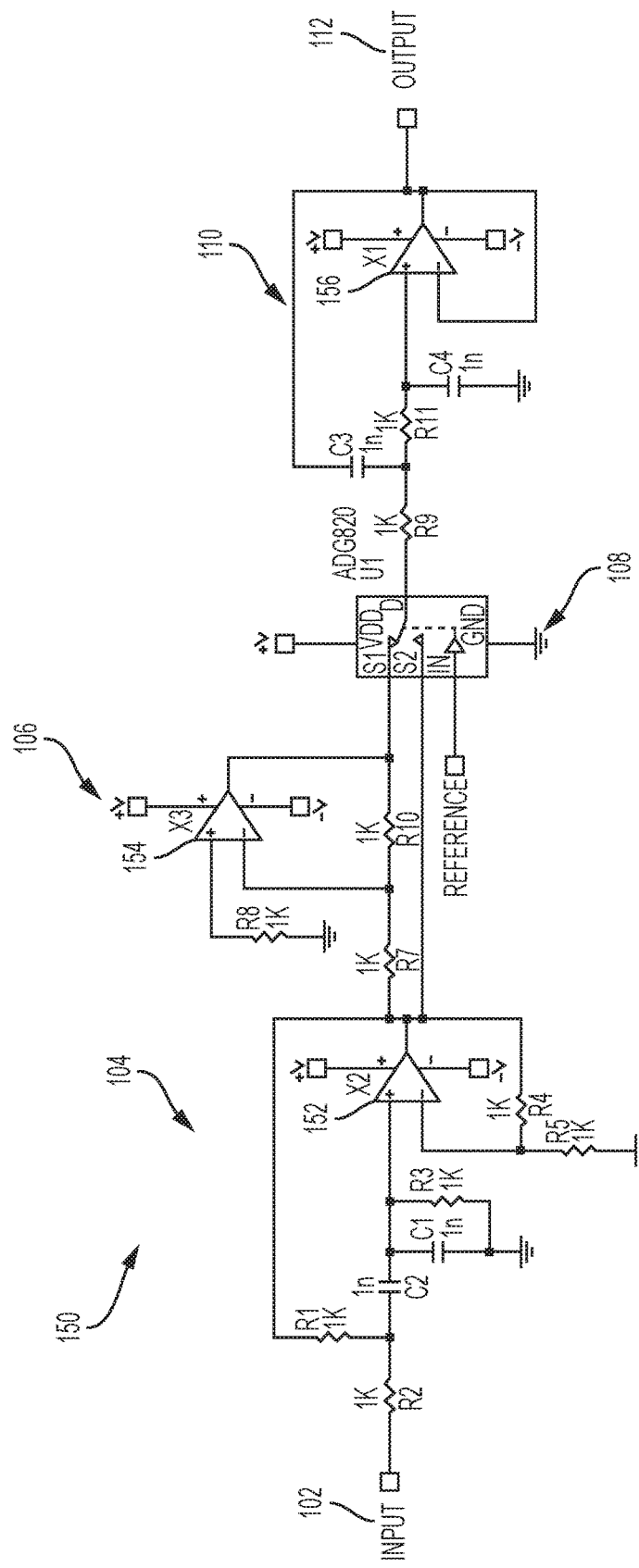

FIG. 1A is a block diagram illustrating a circuit block 100, including a band pass filter 104, an inverter 106, a phase sensitive detector (PSD) 108, and a low pass filter 110, according to some implementations. FIG. 1B shows a more detailed circuit 150 having the same components as shown in the block diagram 100. The band pass filter 104 is a continuous time filter for analog filtering. As shown in FIG. 1A, an input signal 102 is filtered through the band pass filter 104, and one copy of the band-pass-filtered signal passes through the inverter 106. A second copy of the band-pass-filtered signal passes directly to the PSD 108. The inverter 106 generates the negative output of the BPF 104. The PSD 108 is a 2-level mixer and selects the positive band-pass-filtered signal or the negative band-pass-filtered signal (from the inverter 106) for mixing, and outputs a mixed signal. According to one example, the reference input signal is a square wave at a selected mixer frequency, and controls the PSD 108. The mixed signal is output to a low pass filter 110. The low-pass-filtered signal is output as the circuit output signal 112.

FIG. 1B is a detailed version of FIG. 1A, illustrating the circuit components, according to some implementations. As shown in FIG. 1B, the bandpass filter 104 includes an amplifier 152, the inverter 106 includes an amplifier 154, and the low pass filter 110 includes an amplifier 156. The amplifiers 152, 154, 156 provide continuous time synchronous demodulation.

According to various applications, the circuit blocks 100 and 150 may be used to provide synchronous demodulation in a linear variable differential transformer (LVDT) interface, a rotary variable differential transformer (RVDT), or a Bio-Impedance receiver.

Figure 2:
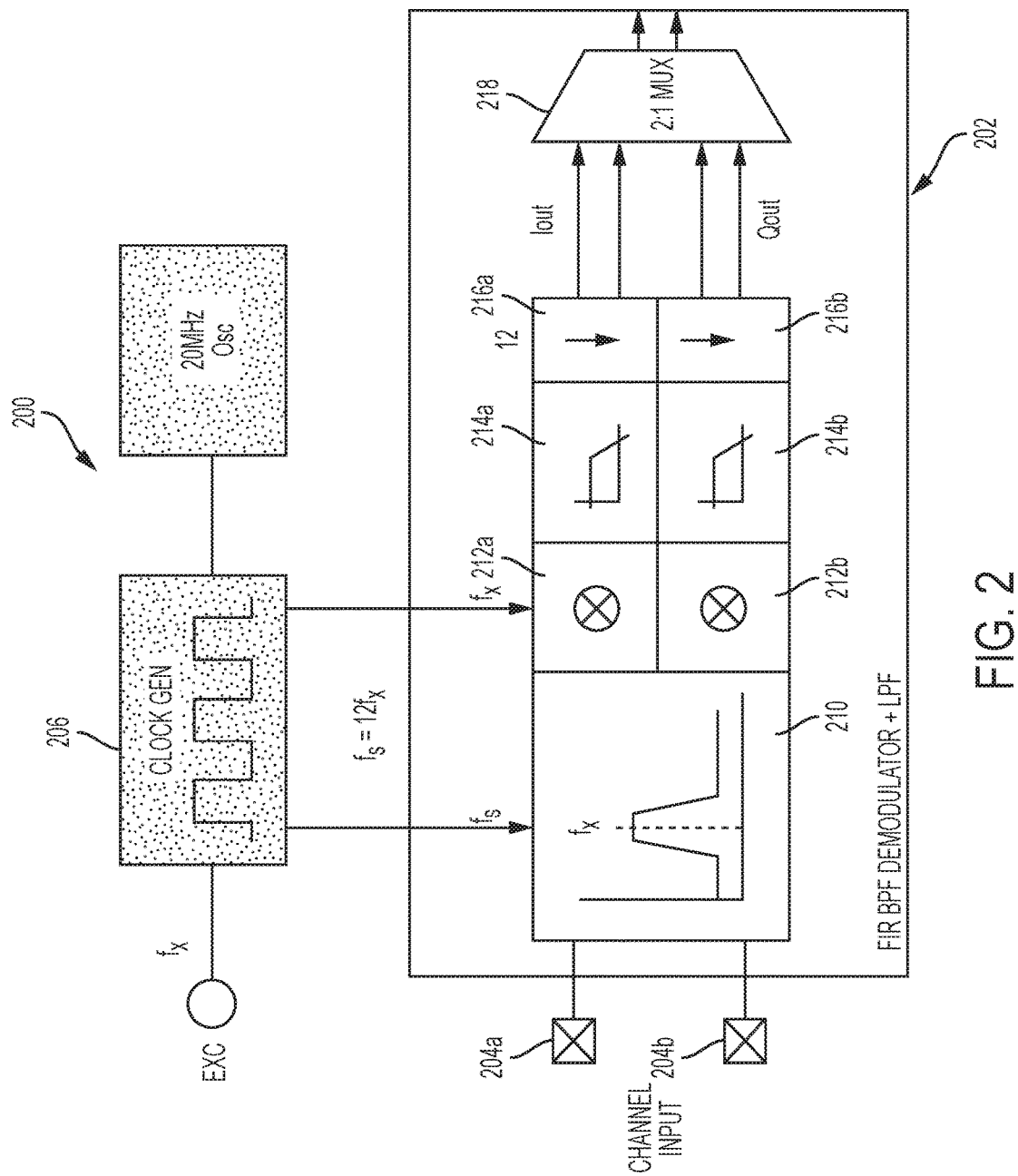
FIG. 2 is a diagram illustrating a sampled analog filter, according to some embodiments of the disclosure.

FIG. 2 is a diagram illustrating a circuit block 200 including a passive sampled analog filter 202 for synchronous demodulation, according to some implementations. The filter 202 is a finite impulse response (FIR) bandpass filter (BPF), and includes 2 input channels 204a, 204b, a bandpass filter 210, first 212a and second 212b mixers, first 214a and second 214b low pass filters, down-sampling elements 216a, 216b, and a multiplexor 218. The circuit 200 also includes a clock 206, and the filter 202 receives clock signals. As shown in FIG. 2, the input to each input channel 204a, 204b is filtered by the passive sampled analog filter 202. The filter 202 provides low power analog filtering. The filter 202 has a small area, and in one example, the filter 202 is less than 0.05 mm$^2$ per channel. In addition to having a small area, the filter 202 is low power, and uses about ten times less power than a traditional filter. The filter 202 consumes much less power than a digital filter. According to one example, the filter provides simultaneous I and Q outputs.

The filter 202 provides a high sampling frequency $f_s$ versus excitation frequency $f_x$. In one example, the sampling frequency $f_s=12*f_x$, and moves $f_x$ away from $f_s/4$. When the excitation frequency is $f_s/4$, some harmonics will alias back onto the excitation frequency. In another example, the filter 202 has a 60 dB stopband rejection. According to one implementation, the filter 202 can have a narrow bandwidth with a programmable sampled low-pass filter, high-pass filter or both. The filters 214a, 214b further reduce the effective bandwidth around the excitation frequency $f_x$ when referred to input. In a further implementation, the filter 210 can be placed after the mixers 212a, 212b.

In one example, the down-sampling elements 216a, 216b downsample the signal by picking every 12th, and the output rate of the filter 202 is one result for every 12 samples ($f_s=12*f_x$). In some examples, low pass filters 214a, 214b after the mixers 212a, 212b allows further reduction of the output rate. The number of samples may be programmable, and in one example, the programmable number of samples determines the output rate. Thus, when $f_s=12$ $f_x$, and $f_x$ programmable between 100 kHz and 500 kHz, then $f_s$ equals between 1.2 MHz and 6 MHz. In one example, $f_x=250$ kHz and $f_s=3$ MHz, and 180 samples are collected in 60 microseconds of touch capture time. In another example, the low-pass filters 214a, 214b filter over multiple cycles.

In some implementations, the excitation signal is a current. In other implementations, the excitation signal is a voltage. In further implementations, the excitation signal is a light source, such as an LED light.

Figure 3:
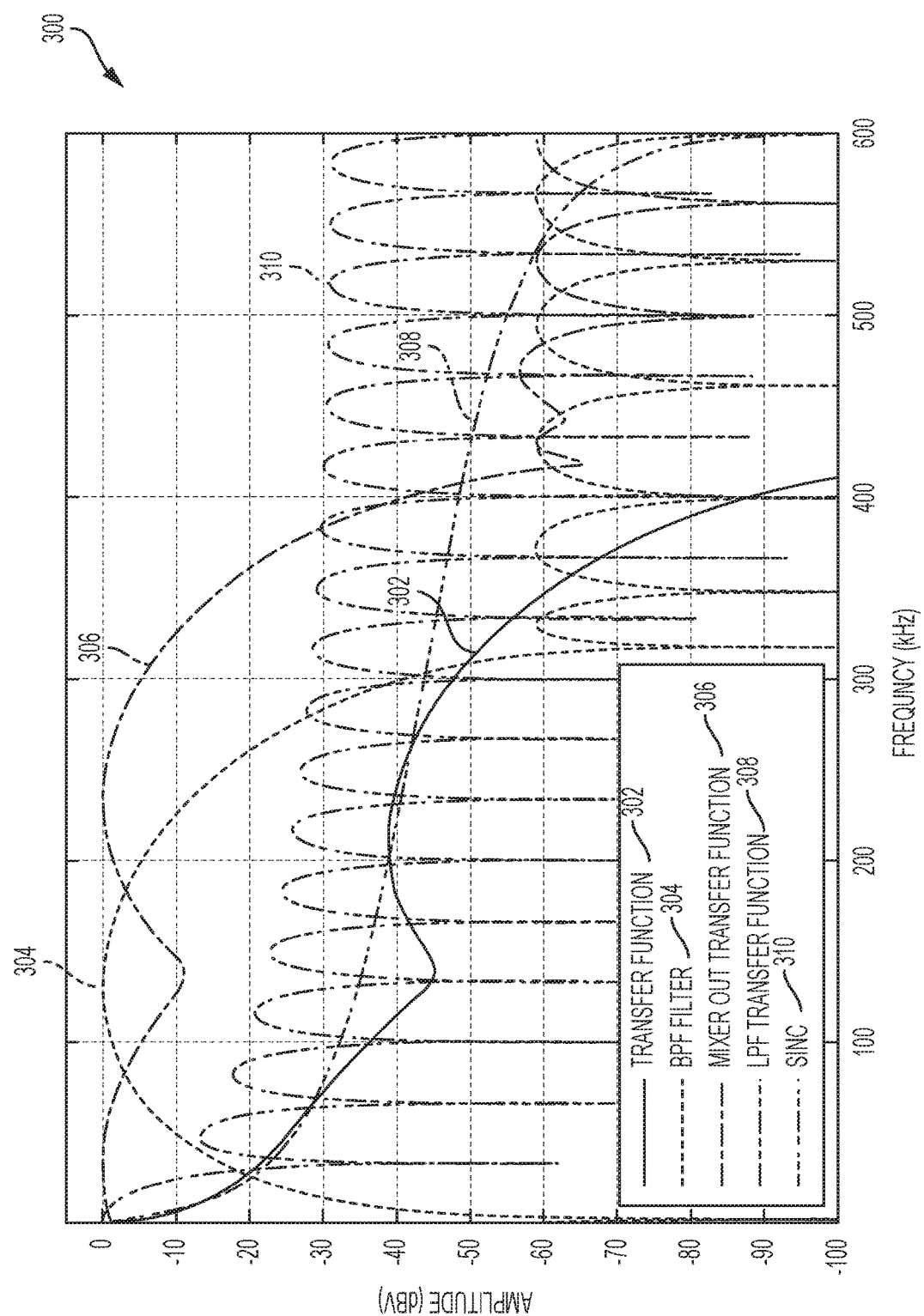
FIG. 3 is a diagram illustrating transfer function spectra for various filters implemented in accordance with FIGS. 1A-1B, according to some embodiments of the disclosure.
Figure 4:
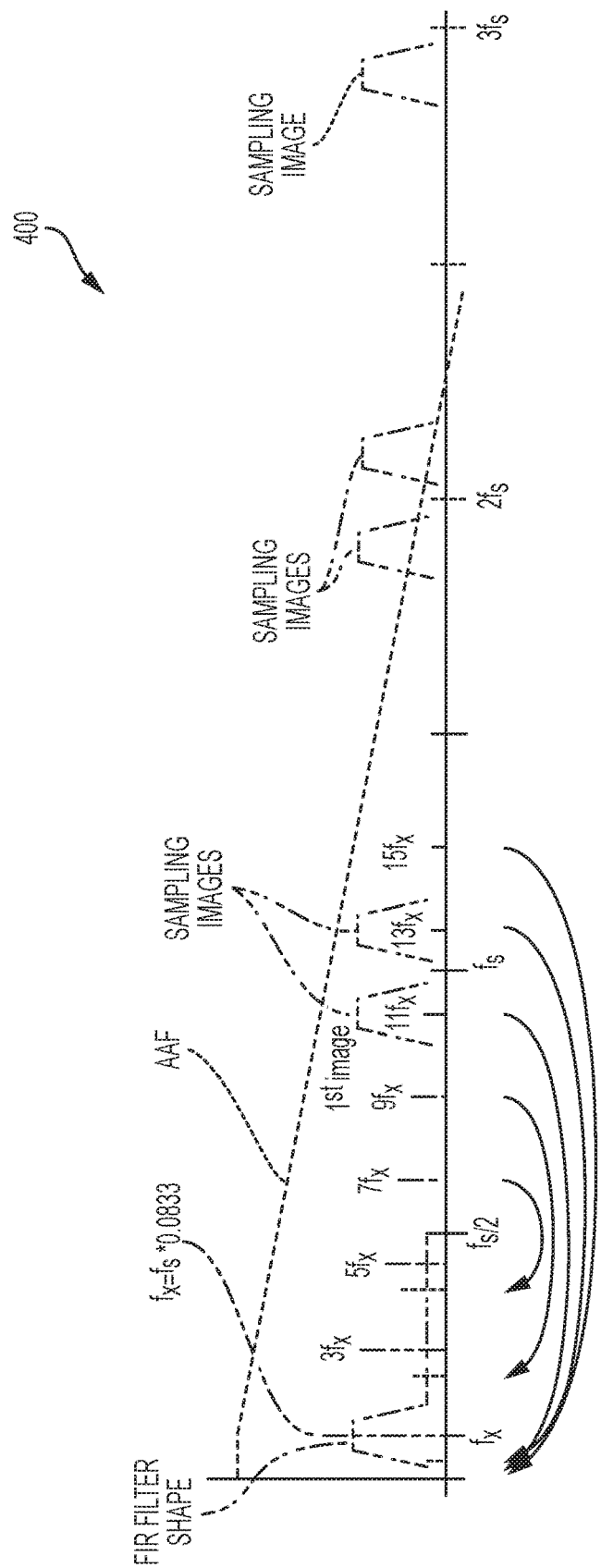
FIG. 4 is a diagram illustrating aliasing of harmonics, according to some embodiments of the disclosure.

FIG. 3 is a diagram 300 illustrating transfer function spectra for various filters implemented in accordance with FIG. 2 when the sampling frequency is 1200 kHz and the excitation frequency is 100 kHz, according to some implementations. For the transfer function spectra in the diagram 200, the dwell time is 30 microseconds, there is normalized BPF gain, the LPF corner is at 2.5 kHz, the band pass filter has a 3 dB bandwidth centered at 52 kHz, the equivalent noise bandwidth (ENBW) is 1.9 kHz, and the Sinc ENBW is 16.7 kHz. In one example, the Sinc ENBW represents the filters 212a, 212b from FIG. 2, which are operated as Sinc filters or averagers having a Sinc function spectral shape FIG. 4 is a diagram 400 illustrating aliasing of harmonics, according to some implementations. The aliasing shown in the diagram 400 can be used for sampled analog technology band pass filter frequency translation. In one example, the $f_s$ to $f_x$ ratio is even. In the example shown in FIG. 4, $f_x=f_s/12$. Lower odd harmonics are aliased away from $f_x$, while higher harmonics are aliased onto $f_x$. For example, in some implementations, the 11$^{th}$ and 13$^{th}$ harmonics are aliased onto $f_x$, while the 7$^{th}$ and 9$^{th}$ harmonics are aliased away from $f_x$. In some implementations, the 23$^{rd}$ and 25$^{th}$ harmonics are aliased onto $f_x$.

Figure 5C:
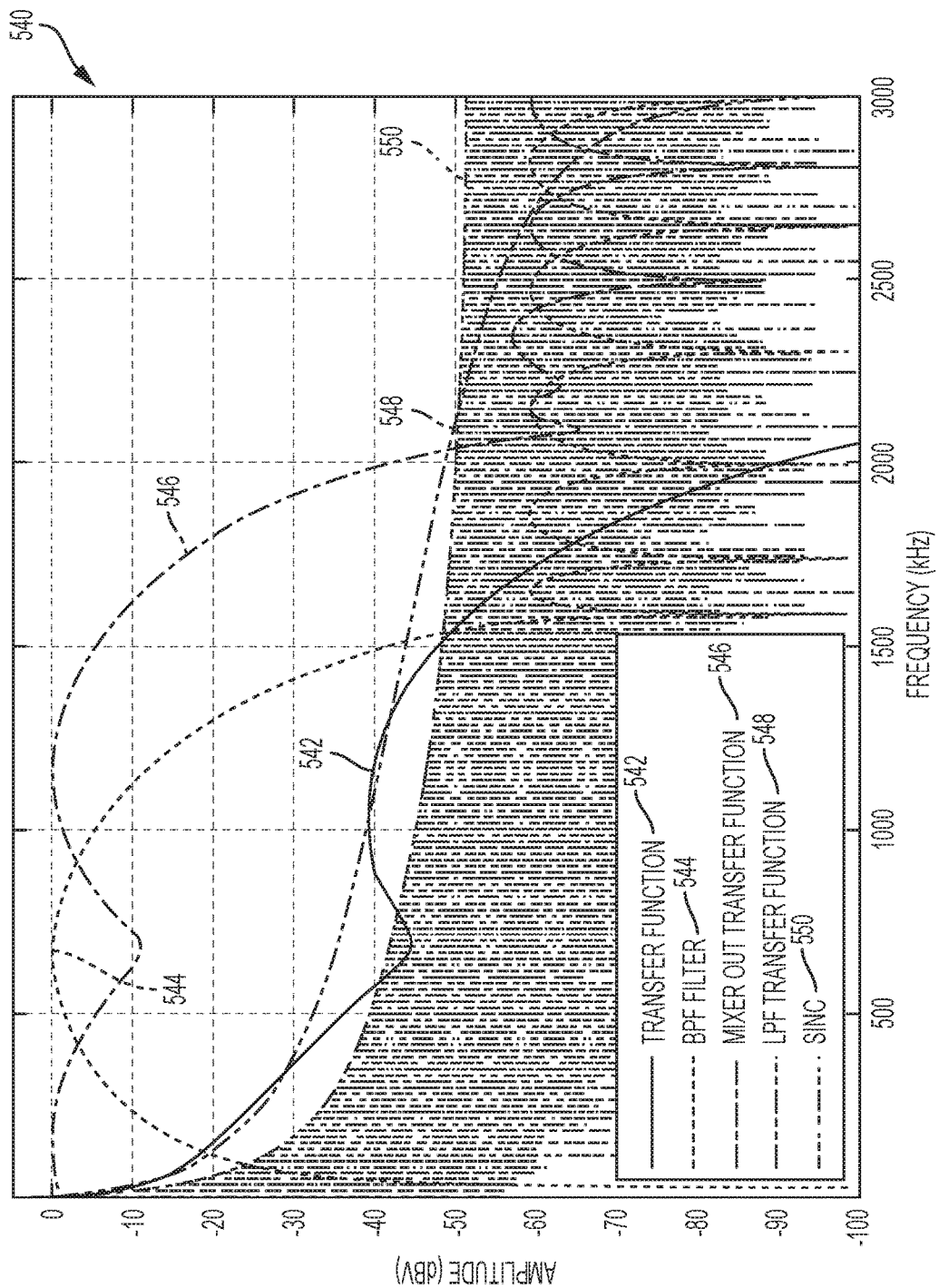

FIGS. 5A-5C and 6A-6C illustrate transfer function spectra for Finite Impulse Response (FIR) Demodulator Referred-to-Input (RTI) Signals. FIGS. 5A-5C are diagrams illustrating a typical sampling system trade off between noise bandwidth and a higher sampling frequency for a low pass filter with a fixed filter frequency at 40 Hz, and a fixed LPF corner at $f_x/40$ according to some implementations. FIG. 5A shows a transfer function spectrum for FIR RTI signals with a sampling frequency of 1200 kHz and an excitation frequency of 100 kHz. As shown, in FIG. 5A, the dwell time is 60 microseconds, there is normalized BPF gain, the LPF corner is at 2.5 kHz, the band pass filter 3 dB bandwidth is centered at 52 kHz, the equivalent noise bandwidth (ENBW) is 1.9 kHz, and the Sinc ENBW is 8.3 kHz.

FIG. 5B shows a transfer function spectrum for FIR RTI signals with a sampling frequency of 3000 kHz and an excitation, frequency of 250 kHz. As shown in FIG. 5B, the dwell time is 60 microseconds, there is normalized BPF gain, the LPF corner is at 6.3 kHz, the band pass filter 3 dB bandwidth is centered at 132 kHz, the equivalent noise bandwidth (ENBW) is 4.7 kHz, and the Sinc ENBW is 8.3 kHz.

FIG. 5C shows a transfer function spectrum for FIR RTI signals with a sampling frequency of 6000 kHz and an excitation frequency of 500 kHz. As shown in FIG. 5C, the dwell time is 60 microseconds, there is normalized BPF gain, the LPF corner is at 12.5 kHz, the band pass filter 3 dB bandwidth is centered at 264 kHz, the equivalent noise bandwidth (ENBW) is 9.5 kHz, and the Sinc ENBW is 8.3 kHz.

Figure 6A:
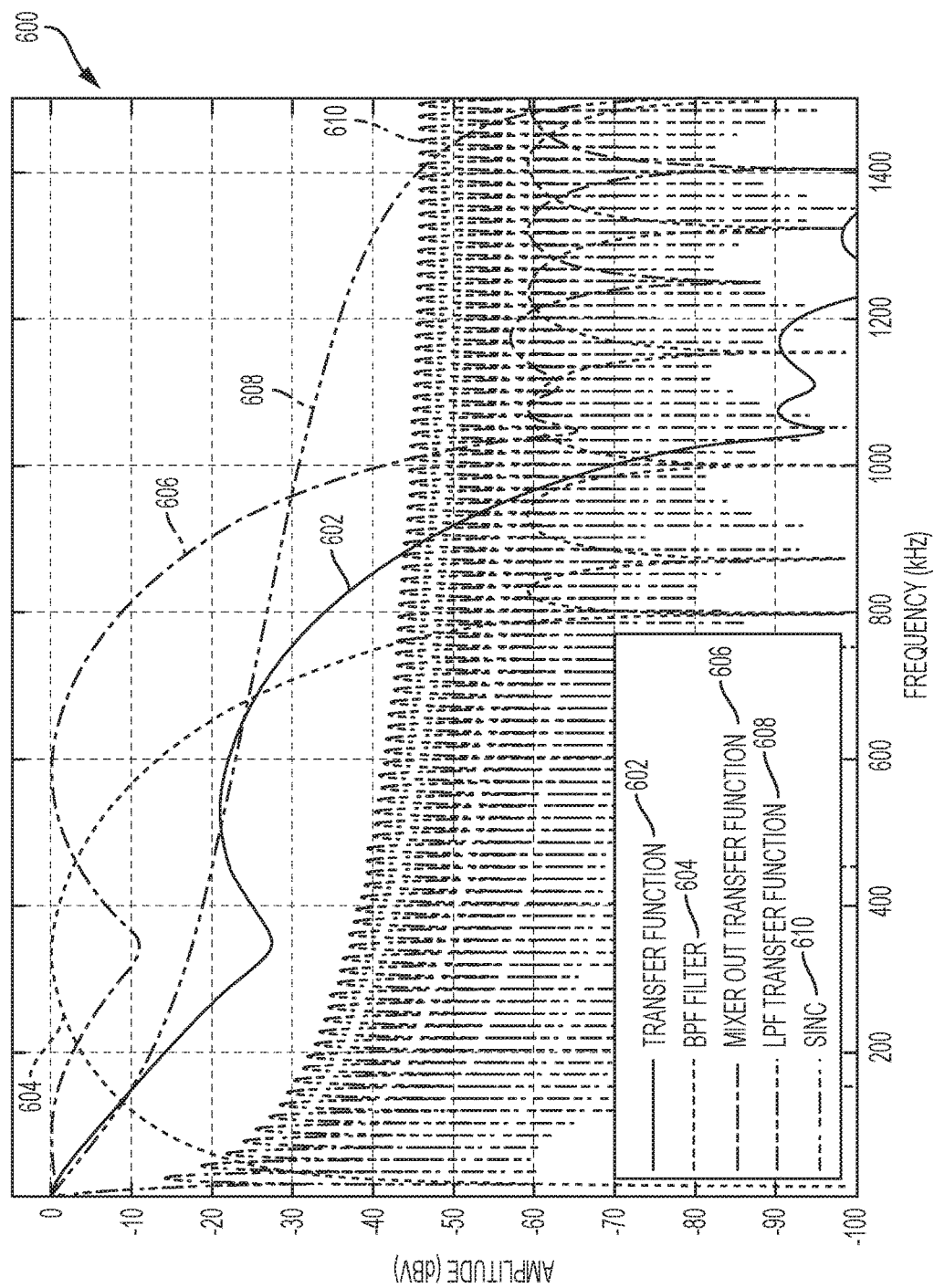
Figure 6B:
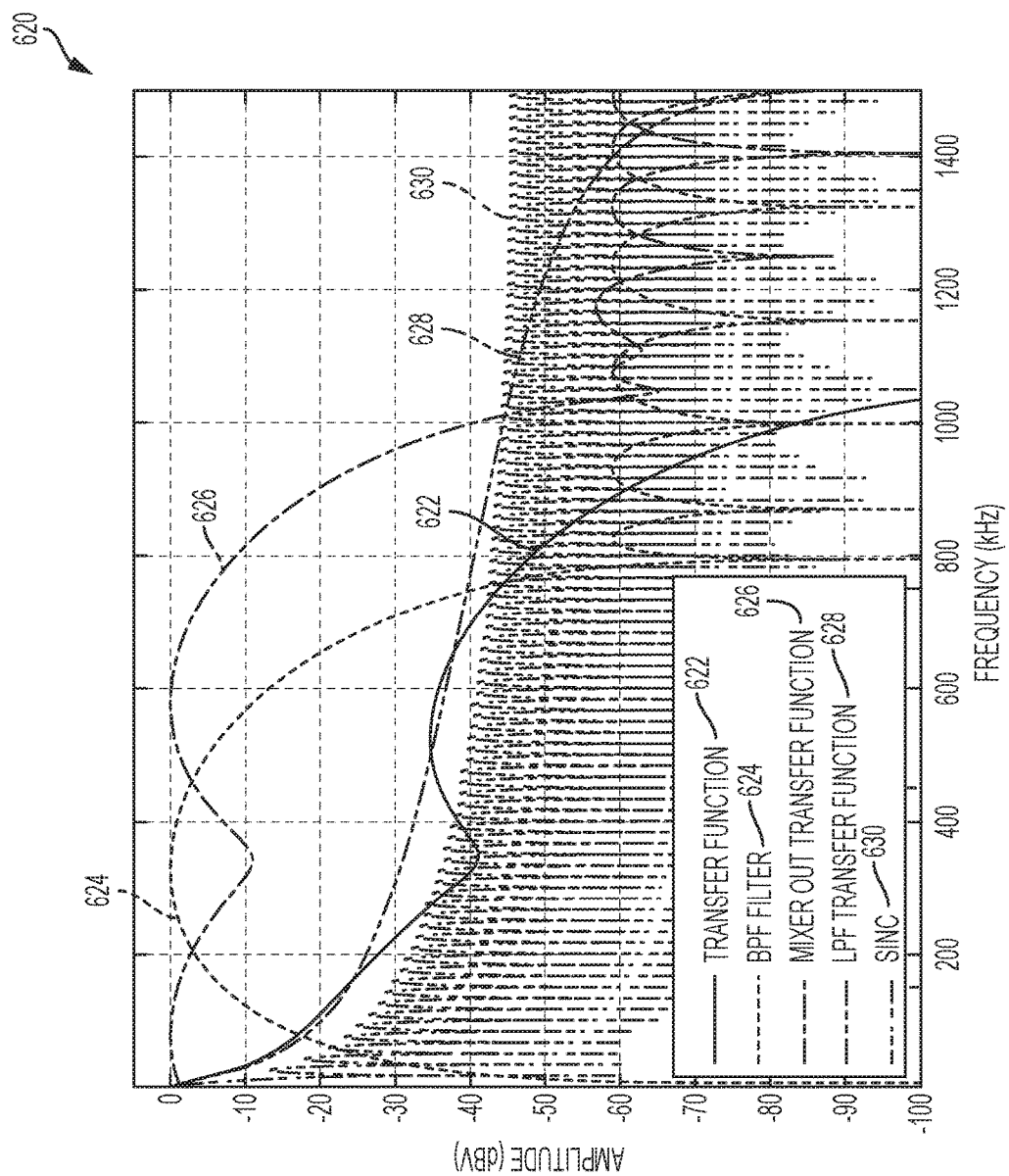

FIGS. 6A-6C are diagrams illustrating the decreased noise bandwidth at higher frequencies for an independently programmable low pass filter, according to some implementations. FIG. 6A shows a transfer function spectrum for FIR RTI signals with a sampling frequency of 3000 kHz and an excitation frequency of 250 kHz. As shown in FIG. 6A, the dwell time is 60 microseconds, there is normalized BPF gain, the LPF corner is at 50 kHz, the band pass filter 3 dB bandwidth is centered at 132 kHz, the equivalent noise bandwidth (ENBW) is 37 kHz, and the Sinc ENBW is 8.3 kHz.

FIG. 6B shows a transfer function spectrum for FIR RTI signals with a sampling frequency of 3000 kHz and an excitation frequency of 250 kHz. As shown in FIG. 6B, the dwell time is 60 microseconds, there is normalized BPF gain, the LPF corner is at 10 kHz, the band pass filter 3 dB bandwidth is centered at 132 kHz, the equivalent noise bandwidth (ENBW) is 7.7 kHz, and the Sinc ENBW is 8.3 kHz.

FIG. 6C shows a transfer function spectrum for FIR RTI signals with a sampling frequency of 3000 kHz and an excitation frequency of 250 kHz. As shown in FIG. 6C, the dwell time is 60 microseconds, there is normalized BPF gain, the LPF corner is at 2.5 kHz, the band pass filter 3 dB bandwidth is centered at 132 kHz, the equivalent noise bandwidth (ENBW) is 1.9 kHz, and the Sinc ENBW is 8.3 kHz.

FIG. 7 is a diagram 700 illustrating touch panel capture timing, according to some embodiments of the disclosure. Touch sampling time decreases with finer pitch panel resolution and larger panel size. According to some implementations, the sampling frequency determines touch capture time. The number of samples collected for a given length of time depends on the sampling frequency. For example:

TABLE 1

| $f_x/f_s$ | 30 µs (dwell time/channel) | 60 µs (dwell time/channel) | 90 µs (dwell time/channel) | 120 µs (dwell time/channel) |
|---|---|---|---|---|
| 100 kHz/1.2 MHz | 36 samples | 72 samples | 108 samples | 144 samples |
| 250 kHz/3 MHz | 90 samples | 180 samples | 270 samples | 360 samples |
| 500 kHz/6 MHz | 180 samples | 360 samples | 540 samples | 720 samples |

In Table 1, the dwell time per channel represents the amount of time available to determine the result.

Figure 8:
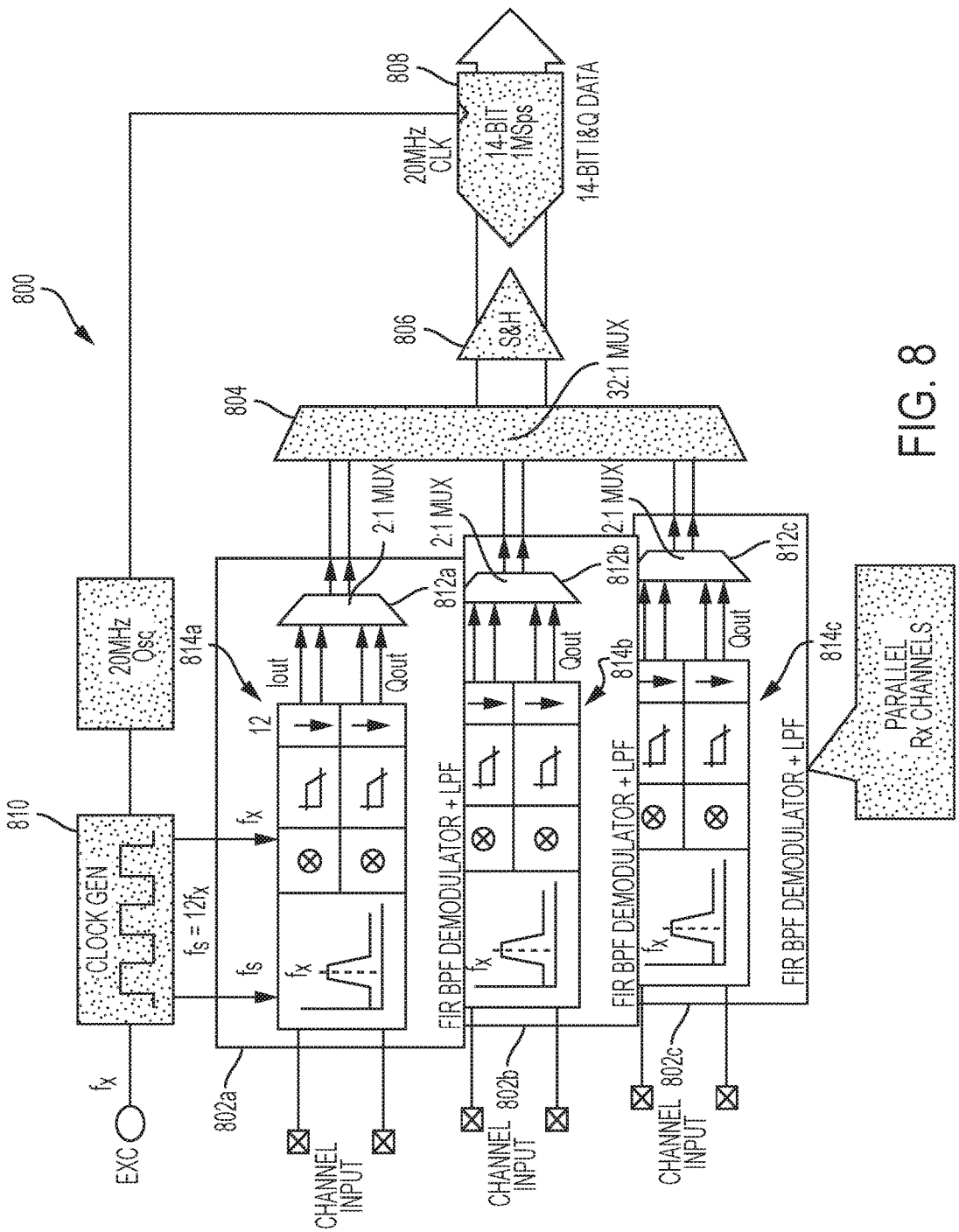
FIG. 8 is a diagram illustrating multiplexor control and ADC conversion, according to some embodiments of the disclosure.

FIG. 8 is a diagram illustrating multiplexor control and ADC conversion, according to some implementations. The circuit 800 includes multiple parallel input channels, multiple parallel FIR BPF demodulators with LPFs 802a-802c, a multiplexor 804, a sample-and-hold module 806, an ADC 808, and a clock 810. According to one implementation, the circuit 800 shown in FIG. 8 includes 32 parallel input channels multiplexed into a single ADC 808. The output includes $I_{out}$ and $Q_{out}$, and therefore includes 64 ADC measurements. Each input channel has a local 2:1 multiplexer (MUX) 812a-814c in a FIR BPF demodulator block 802a-802c, as described in greater detail with respect to FIG. 2.

In one example, the circuit 800 includes a 1 MSps ADC 808 having a successive approximation register architecture. According to one implementation, the Sampled Analog Technology (SAT) demodulation blocks 814a-814c lower the ADC requirements by filtering out unwanted signals to allow decimation and a slower ADC sampling rate. In one example, using a 20 MHz ADC clock takes 50 ns per bit trial. In another example, a 14-bit. ADC uses 20 clock cycles per conversion, include 3 auto-zero (AZ) cycles, 16 bit trials, and one load output clock. Thus, 20 cycles at 50 ns each yields 1 µs$T_{ADCCONV}$ per channel, where 1 µs$T_{ADCCONV}$ is the time for each conversion. Accordingly, 64 I&Q channels take 64 microseconds for conversion time. 64 channel inputs can be received by the Dual 14-Bit channels.

Figure 9:
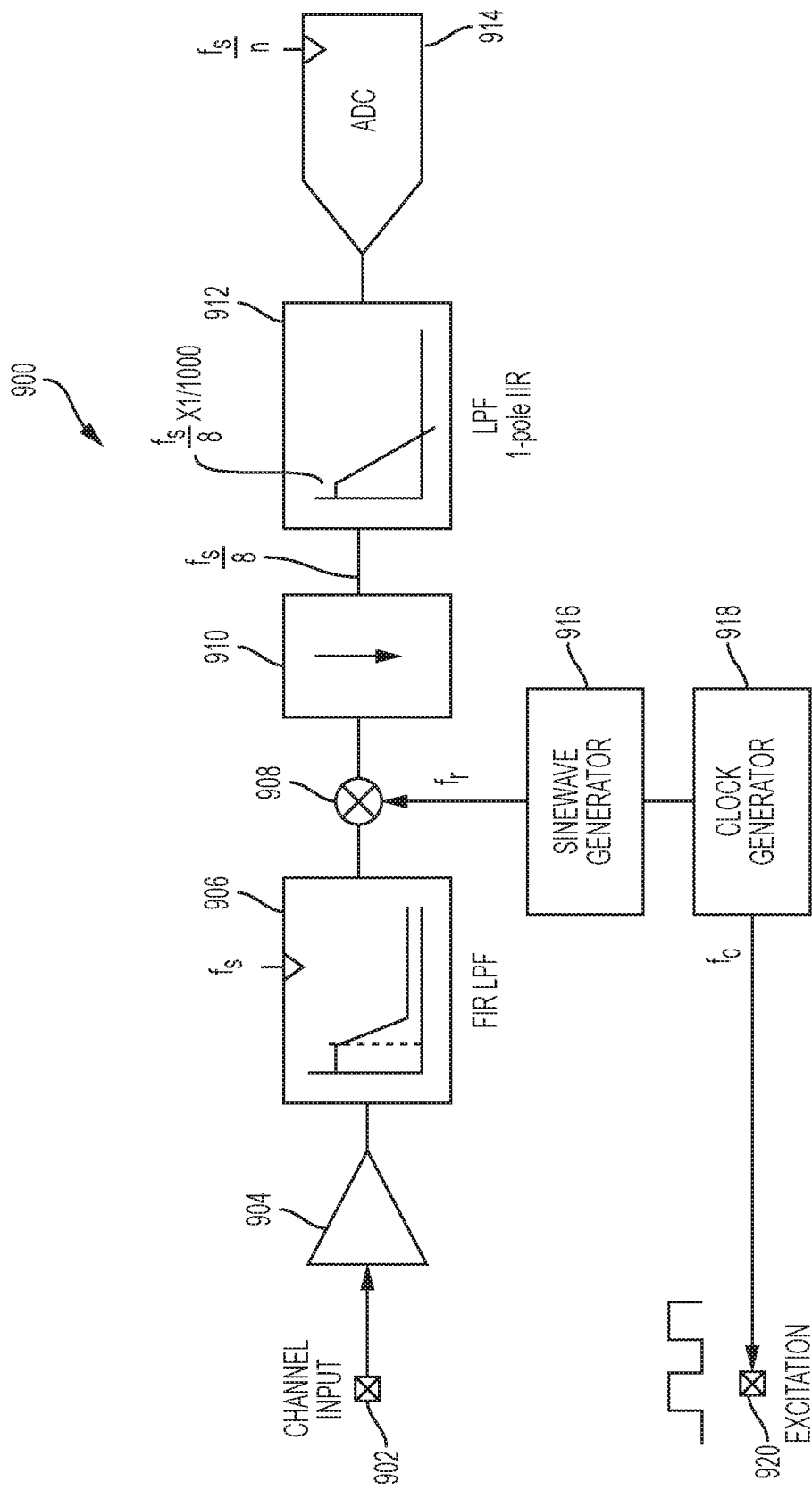
FIG. 9 is a diagram illustrating a synchronous demodulator, according to some embodiments of the disclosure.

FIG. 9 is a synchronous demodulator circuit 900, according to some embodiments of the disclosure. The circuit 900 includes an input 902, an amplifier 904, an FIR LPF 906, a mixer 908, a down sampler 910, IIR LPF 912, ADC 914, sinewave generator 916, clock generator 918, and excitation 920. The excitation signal 920 is sent to the element to be measured, for example a sensor or a body, where it is modified and the modified excitation signal is returned to the circuit 900 as the input. The input channel 902 receives an input signal, which is amplified at the amplifier 904. The amplified input signal is low pass filtered by the FIR LPF 906. At the mixer 908, the low pass filtered signal is mixed with a sinewave generated by the sinewave generator 916. The mixed signal is reduced at the module 910. In one example, the sampling frequency of the mixed signal is divided by 8. The reduced signal is low pass filtered at the 1-pole IIR LPF 912, and the low pass filtered signal is converted to a digital signal by the ADC 914.

Figure 10:
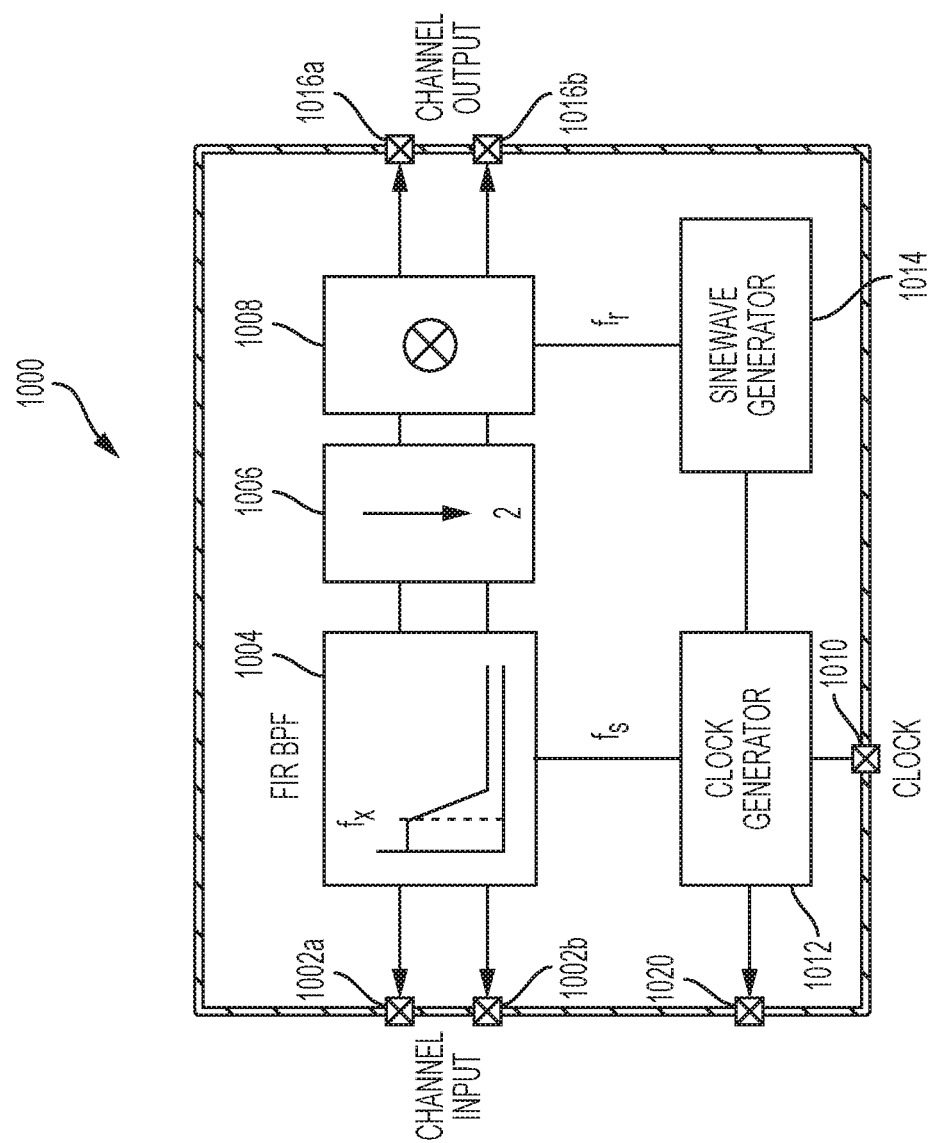
FIG. 10 is a diagram illustrating a BPF synchronous demodulator having a single channel output, according to some embodiments of the disclosure.

FIG. 10 is a diagram illustrating a BPF synchronous demodulator 1000 having an input channel 1002a, 1002b, a FIR BPF 1004, a decimation module 1006, a mixer 1008, a clock generator 1010, sinewave generator 1012, a single channel output 1014a, 1014b, and an excitation channel 1020 according to some implementations. In this implementation, the input channel 1002a, 1002b receives an input signal, which is band pass filtered by the FIR BPF 1004. The FIR BPF 1004 receives the sampling frequency $f_s$ from the clock generator 1012. The band pass filtered signal is decimated at the module 1006. At the mixer 1008, the decimated band pass filtered signal is mixed with a sinewave generated by the sinewave generator 1014. The mixed signal is output to the single channel output 1016a 1016b.

Figure 11:
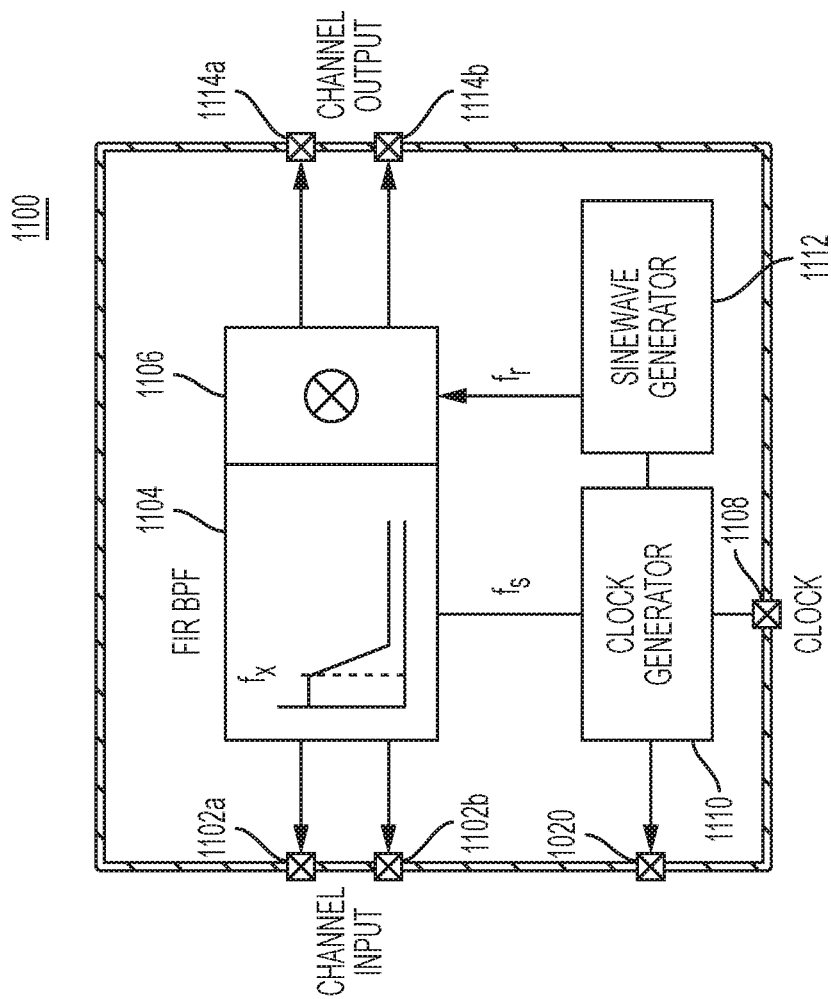
FIG. 11 is a diagram illustrating another example of a BPF synchronous demodulator having a single channel output, according to some embodiments of the disclosure.

FIG. 11 is a diagram illustrating another example of a BPF synchronous demodulator 1100 having a single channel output, according to some implementations. The BPF synchronous demodulator 1100 includes channel inputs 1102a, 1102b, a FIR BPF 1104, a mixer 1106, a clock 1108, a clock generator 1110, a sinewave generator 1112, a single channel outputs 1114a, 1114b, and an excitation 1110. An input signal received at the input channel 1102a, 1102b is band pass filtered by the FIR BPF 1104, and the band-pass-filtered signal is mixed with a sinewave at the mixer 1106. The mixed signal is output at the single channel outputs 1114a, 1114b. According to one feature, the demodulator 1100 has no decimation.

Figure 12A:
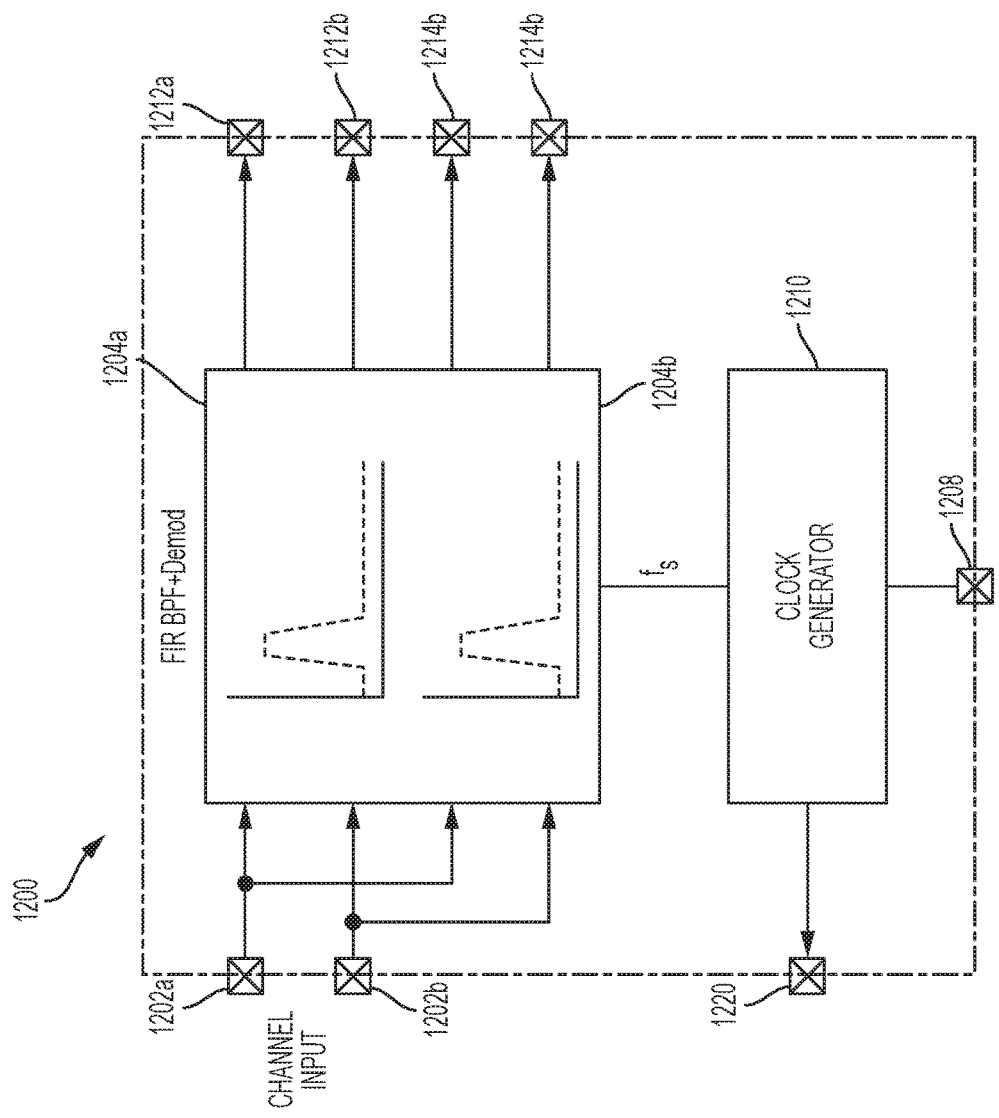
FIGS. 12A and 12B are diagrams illustrating a synchronous demodulator, according to some embodiments of the disclosure.

FIG. 12A is a diagram illustrating another example of a synchronous demodulator 1200, according to some implementations. In the synchronous demodulator 1200, the mixer is merged with the FIR BPF. Thus the demodulator 1200 includes channel inputs 1202a, 1202b, first 1204a and second 1204b FIR BPFs, a clock 1208, a clock generator 1210, and first 1211a, 1211b and second 1214a, 1214b channel outputs. An input signal received at the input channel 1202a, 1202b is split into I and Q components, and the first FIR BPF 1204a filters the I data, while the second FIR BPF 1204b filters the Q data. The filtered I data is output to the first channel outputs 1211a, 1211b, and the filtered Q data is output to the second channel outputs 1214a, 1214b.

Figure 12B:
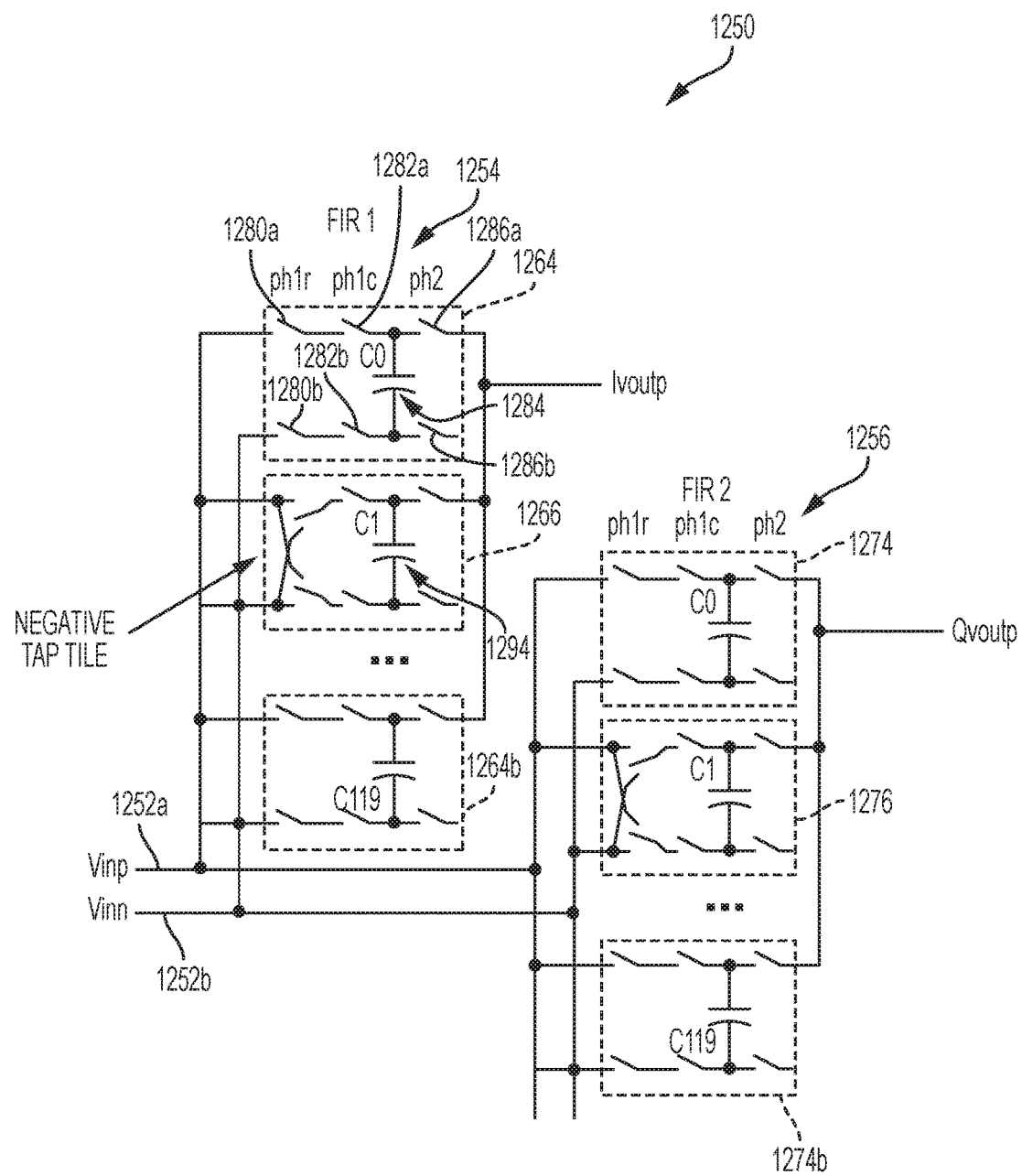

FIG. 12B is a diagram illustrating a synchronous demodulator 1250 showing the circuit components of the demodulator 1250. In particular, FIG. 12B shows one example of a circuit design for implementing the demodulator 1200 shown in FIG. 12A. An input signal is received at the channel inputs 1252a, 1252b and the input is split and input to a first FIR filter 1254 and a second FIR filter 1256. As shown in FIG. 128, each FIR filter 1254, 1256 includes multiple tiles, including positive 1264a, 1264b, 1274a, 1274b and negative 1266, 1276 tap tiles. In one implementation, the FIR filters 1254 and 1256 are low pass filters. In another implementation, the FIR filters 1254 and 1256 are band-pass filters.

A positive tap tile such as a first tile 1264a, includes a top line having first 1280a, second 1280b, third 1282a, fourth 1282b, fifth 1286a, and sixth 1286b switches and a capacitor 1284. The tile 1264a receives the split input signal. The first part of the input signal Vinp is received on a first line, which includes the first 1280a switch followed by the third switch 1282a, then connects to the first terminal of the capacitor 1284, and then the fifth switch 1264a. The second part of the input signal Vinn is received on a second line, which includes the second 1280b switch followed by the fourth switch 1282b, then connects to a second terminal of the capacitor 1284, and then the sixth switch 1264b. The first line is output from the first tile and connects with outputs from other tiles in the first FIR BPF 1254 and the I component of, the output channel. Thus, an output signal from the first line of the first tile 1264a connects with output signals from other tiles in the first FIR BPF 1254 to form the I-data output.

A negative tap tile such as a second tile 1266 has a similar design to that described with respect to the first tile 1264a, but the switches are designed such that the two parts of the input signal are received on the opposite lines. Thus, the second part of the input signal Vinn is received on a first line and connects to the first terminal of the capacitor 1294 and the first part of the input signal Vinp is received on a second line and connects to the second terminal of the capacitor 1294. As described above with respect to the first tile 1264a, the first line is output from the second tile 1266 and thus, an output signal from the first line of the second tile 1266 connects with output signals from other tiles in the first FIR BPF 1254 to form the I-data output.

Figure 13:
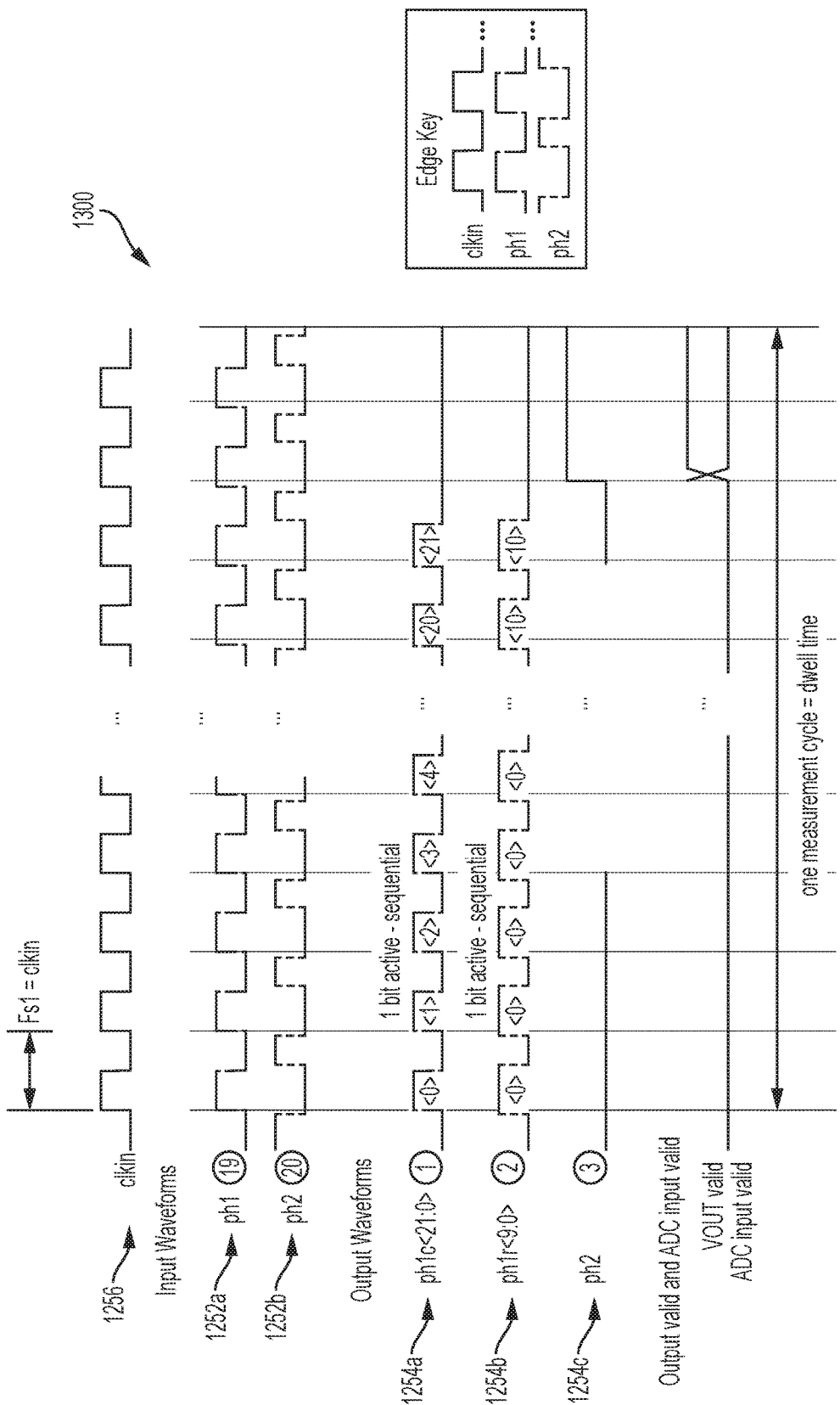
FIG. 13 is a timing diagram for the operation of a BPF demodulator, according to some embodiments of the disclosure.

FIG. 13 is a timing diagram 1300 for the operation of the BPF synchronous demodulator 1250, according to some implementations. FIG. 13 shows a clock signal 1256, a first input waveform ph1 1302 and a second input waveform ph2 1302b, and a first output waveform ph1c 1254a, a second output waveform ph1r 1254b, and a third output waveform ph2 1254c over one measurement cycle (also referred to as the dwell time). According to some implementations, the output waveforms 1254a, 1254b, 1254c are used for controlling the switches in the first 1254 and second 1256 FIR BPFs.

Figure 14:
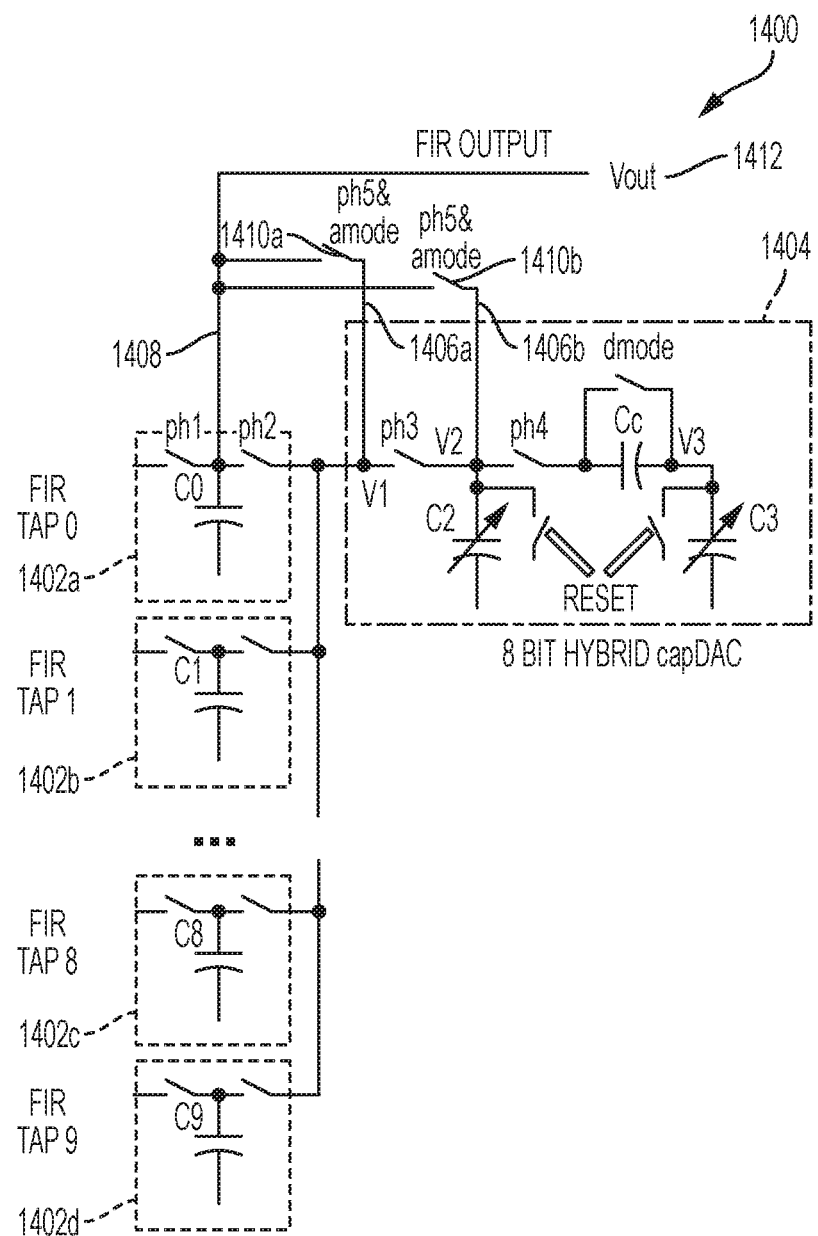
FIG. 14 is a diagram illustrating a BPF synchronous demodulator with a programmable DAC mixer, according to some embodiments of the disclosure.

FIG. 14 is a diagram illustrating the circuitry of a BPF synchronous demodulator 1400 having, a single channel output 1412 and a programmable DAC mixer 1404, according to some implementations. The demodulator 1400 includes multiple FIR filter taps 1402a-1402d. In one example, there are ten FIR filter taps 1402a-1402d. An input signal is filtered by the filter sections 1402a-1402d and the filtered signals are mixed by a hybrid cap DAC 1404. The hybrid cap DAC 1404 has two parallel output lines 1406a, 1406b, which are both joined to an output 1408 line from the first tap 1402a. Each of the output lines 1406a, 1406b from the mixer 1404 passes through a switch 1410a, 1410b. The switches 1410a, 1410b may be controlled by a timing diagram similar to the timing diagram 1300 shown in FIG. 13. The output from the mixer 1404 and the output from the first tap 1402a are joined to output the FIR output Vout 1412. According to various implementations, the diagram of FIG. 14 is a simplified circuit, which shows one side of a differential circuit. In some implementations, the demodulator 1400 is singled-ended. According to some examples, the demodulator 1400 is one implementation of the FIR BPF 1104 and the mixer 1106 of FIG. 11.

Figure 15:
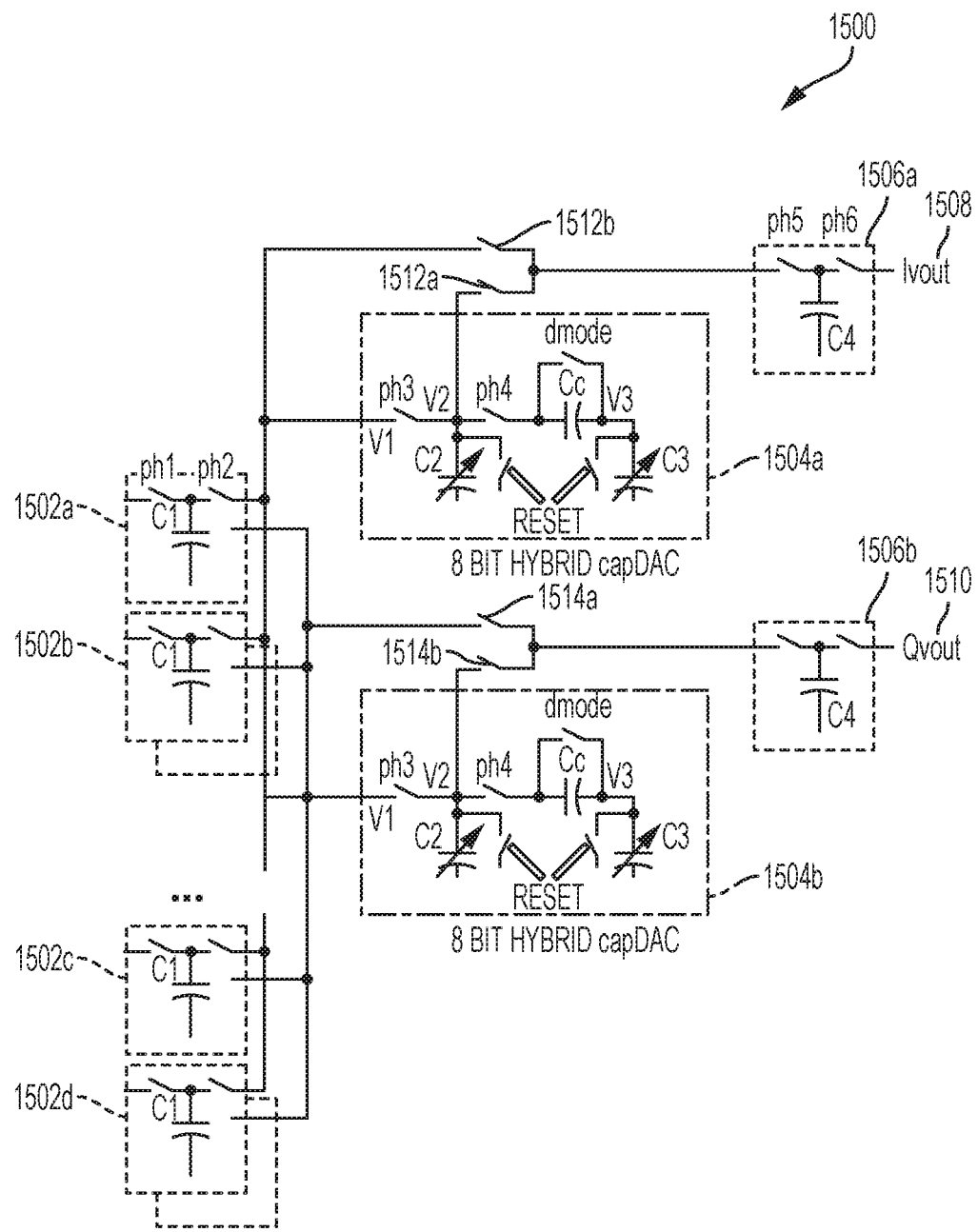
FIG. 15 is a diagram illustrating a BPF synchronous demodulator with programmable DAC mixers, according to some embodiments of the disclosure.

FIG. 15 is a diagram illustrating a BPF synchronous demodulator 1500 having multiple FIR filter taps 1502a-1502d, an I output 1508, a Q output 1510, and first 1504a and second 1504b programmable DAC mixers, according to some implementations. In one example, there are ten FIR filters 1502a-1502d. According to various implementations, the FIR filter taps 1502a-1502d may be taps in a low pass filter, a band-pass filter, or a high-pass filter. An input signal is processed by the filter taps 1502a-1502d. The I component of the filtered input signal is input to the first DAC mixer 1504a, and the Q component of the filtered input signal is input to the second DAC mixer 1504b. In one example, the first 1504a and second 1504b DAC mixers are hybrid capacitive DACs (hybrid capDACs), and in one example, the mixers 1504a, 1504b are 8 bit hybrid capDACs. The first DAC mixer 1504a outputs mixed I-data to first filter 1506a, which filters the mixed I-data and outputs the I output 1508. The second DAC mixer 1504b outputs mixed Q-data to a second filter 1506b, which filters the mixed Q-data and outputs the Q output 1520. According to one example, the first 1506a and second 1506b filters are single pole lowpass filters. According to one implementation, the number of taps is twenty, and the sampling rate is 9.

As shown in FIG. 15, there is a first switch 1512a between the mixed I-data output from the first DAC mixer 1504a and the input to the first filter 1506a, and a line with a second switch 1512b connecting the I components of the filtered input signal and the first filter 1506a. Similarly, there is a third switch 1514a between the mixed Q-data output from the second DAC mixer 1504b and the input to the second filter 1506b, and a line with a fourth switch 1514b connecting the Q components of the filtered input signal and the second filter 1506b. In some implementations, a timing diagram, similar to the diagram 1300 in FIG. 13, controls operation of the first 1512a, second 1512b, third 1514a, and fourth 1514b switches.

Figure 16:
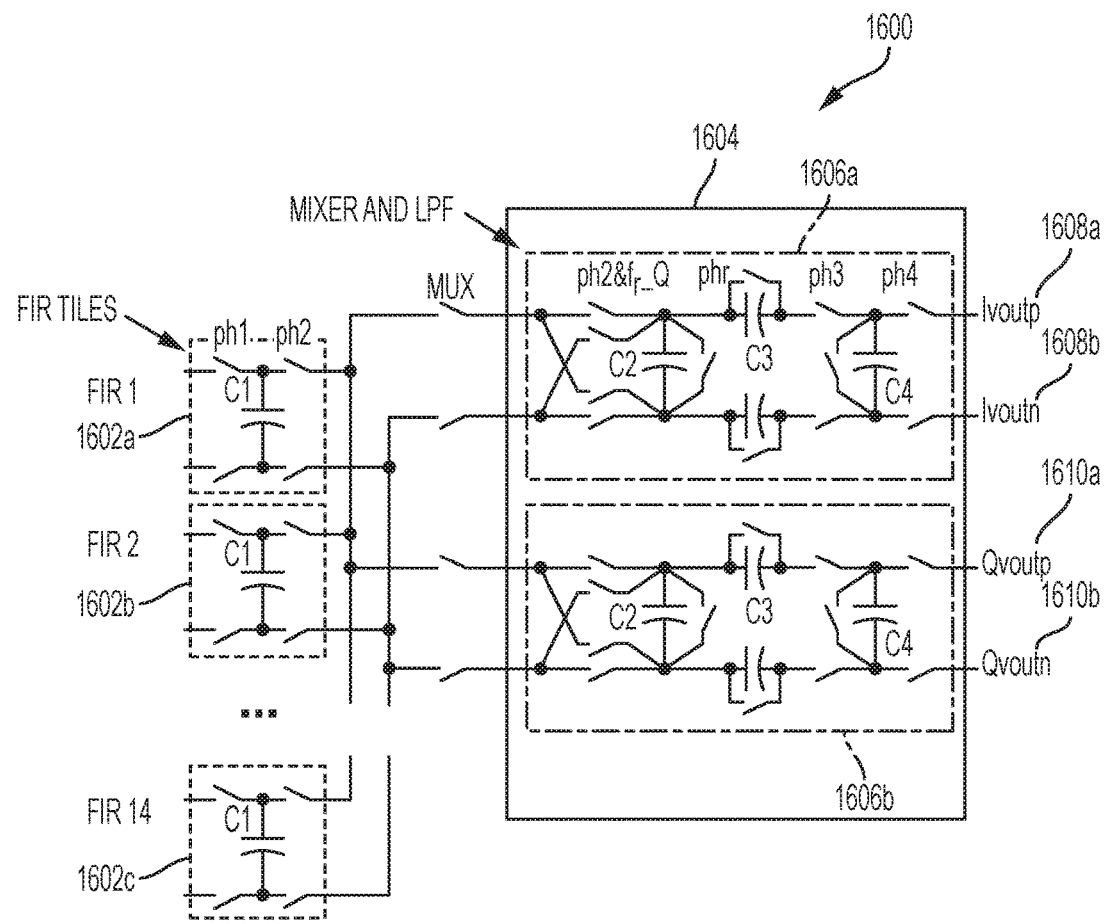
FIG. 16 is a diagram illustrating a BPF synchronous demodulator having a fixed 2-level mixer, according to some embodiments of the disclosure.

FIG. 16 is a diagram illustrating a BPF synchronous demodulator 1600 including multiple FIR filter taps 1602a-1602c, a fixed 2-level mixer 1604 with an added LPF filter, and I outputs 1608 and Q outputs 1610, according to some implementations. In one example, there are fourteen FIR filters 1602a-1602c. The FIR filter including taps 1602a-1602c may be a low pass filters, a band-pass filters, or a high-pass filters. An input signal is filtered by the input filter having taps 1602a-1602c, separated into I and Q components, and output to the two-level mixer 1604. The two-level mixer 1604 has a first mixer-and-filter module 1606a and a second mixer-and-filter module 1606b. In one example, the first mixer-and-filter module 1606a is a +1 level and the second, mixer-and-filter module 1606b is a 0 level. The I component of the filtered input signal is input to the first mixer-and-filter module 1606a of the mixer 1604, and the Q component of the filtered input signal is input to the second mixer-and-filter module 1606b of the mixer 1504. The first 1606a and second 1606b mixer-and-filter module of the mixer 1604 each include a low pass filter. The first mixer-and-filter module 1606a of the mixer 1604 mixes and filters the I components of the filtered input signal and outputs I outputs 1608a, 1608b. The second mixer-and-filter module 1606b of the mixer 1604 mixes and filters the Q components of the filtered input signal and outputs Q outputs 1610a, 1610b. According to one implementation, the number of taps is fourteen.

Figure 17:
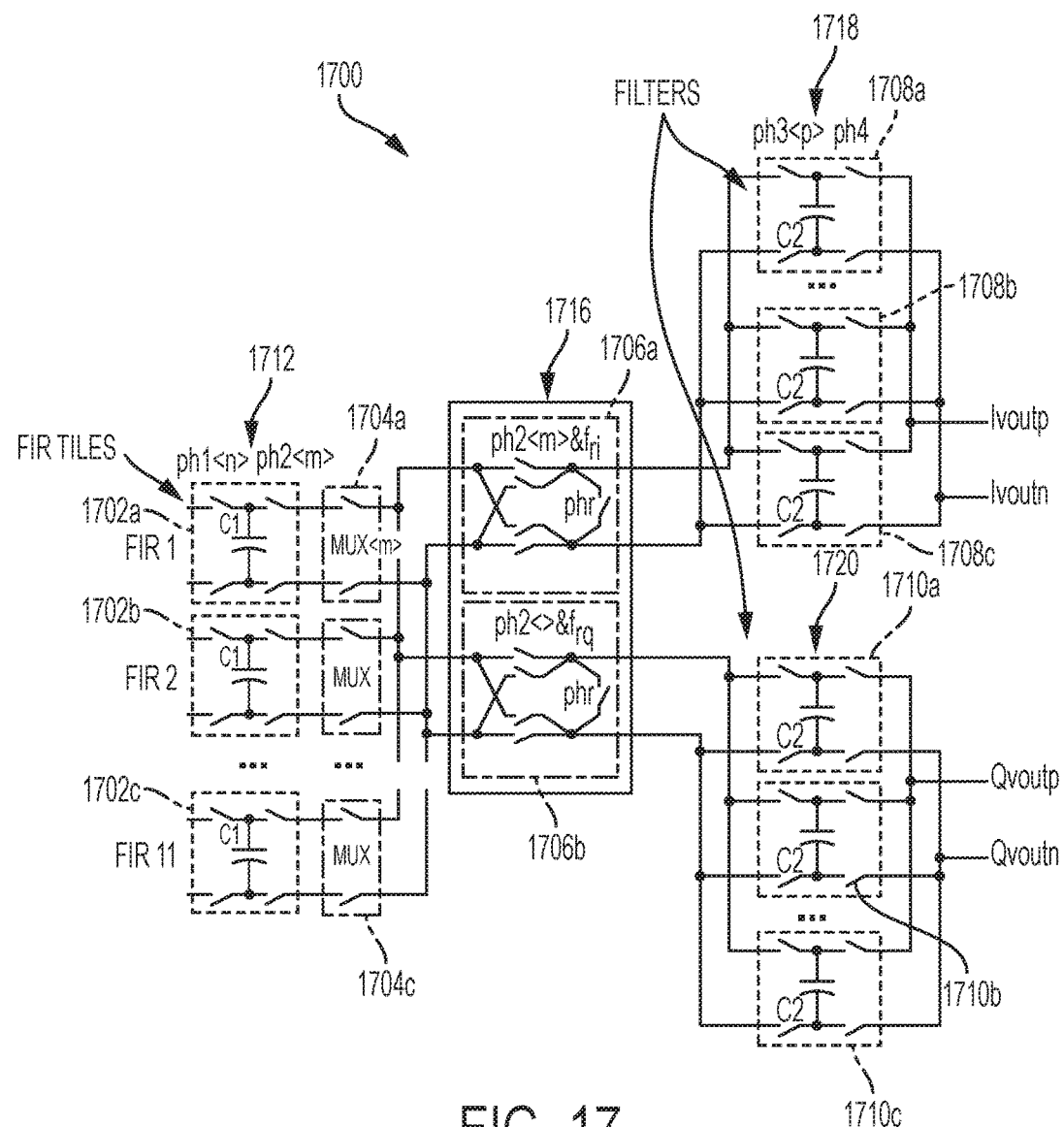
FIG. 17 is a diagram illustrating a BPF synchronous demodulator, according to some embodiments of the disclosure.

FIG. 17 is a diagram illustrating, a BFF synchronous demodulator 1700 including a first filter 1712, multiplexors 1704a-1704c, a mixer 1716, and second 1718 and third 1720 filters. In various implementations, the mixer 1716 can be a two-level mixer (−1, +1) or a three-level mixer (−1, 0, +1), depending on the timing and the configuration of the inversion switches. The input filter includes taps 1702a-1702c. An input signal is filtered by the input filter 1712, separated into I and Q components, processed by a multiplexor 1704a-1704c, and output to the mixer 1716. The 1716 has a first mixer module 1706a and a second mixer module 1706b. In one example, the first mixer module 1706a is a +1 level and the second mixer module 1706b is a −1 level. The first mixer module 1706a mixes the I components of the filtered input signal and outputs I components to the second filter 1718. The second mixer module 1706b mixes the Q components of the filtered input signal and outputs Q components to the third filter 1720. The second filter 1718 filters the I components and outputs the I-data output. The third filter 1720 filters the Q components and outputs the Q-data output.

Figure 28:
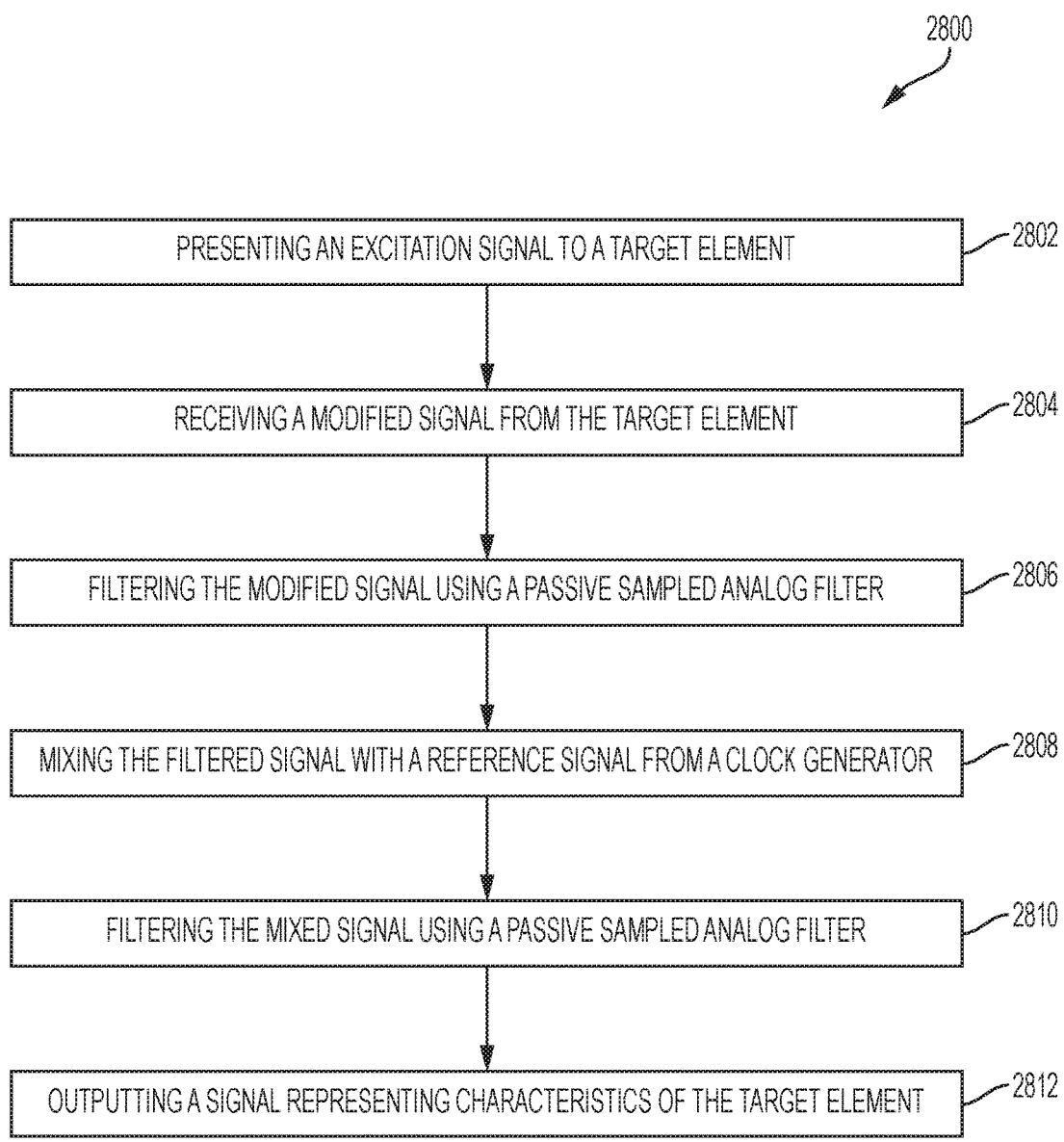
FIG. 28 is a diagram illustrating a method for synchronous demodulation.

FIG. 28 is a diagram illustrating a method 2800 for synchronous demodulation using passive sampled analog filtering. The method 2800 includes, at step 2802, presenting an excitation signal to a target element and, at step 2804, receiving, at an input, a modified signal from the target element. In some examples, the target element may be a sensor, a transformer, a body, or a body part. At step 2806, a passive sampled analog filter filters the modified signal. In some examples, the filter removes noise from the signal. At step 2808, the filtered signal is mixed with a reference signal from a clock generator. At step 2810, the mixed signal is filtered by a second passive sampled analog filter. At step 2812, the second passive sampled analog filter outputs a signal representing characteristics of the target element. In some examples, the output signal includes an, output I-component of the signal and an output Q-component of the signal.

In some implementations, the excitation signal is a current and the modified signal received at the input is a voltage. In other implementations, the excitation signal is a voltage, and the modified signal received at the input is a current.

Bio-Impedance Measurements

Body impedance measurements can be used to provide insight into a number of physiological properties. The frequency at which the impedance measurement is taken affects the path that electricity takes through the body and this enables different physiological processes to be measured. At low frequencies (<1 kHz), the electricity flows mostly in the surface layers of the skin. As the frequency is increased (to 10's or 100's of kHz), the electricity increasingly flows in the interior cells of the body. By making body impedance measurements at low and high frequencies, stress, heart rate, body mass index, calorie intake and hydration among other physiological processes can be measured. In some applications, an internal electrode or probe is used to make internal body impedance measurements such as measuring fluid in the lungs. In some implementations, a synchronous demodulator is used for electrical bioimpedance spectroscopy, which includes a sweep of impedance measurements over a range of frequencies.

To measure the body impedance, a current is forced to flow through the body, and the developed voltage is measured. The forced current is the excitation signal. The voltage developed across the body is the received signal. From the known excitation signal and the measured received signal, the body impedance can be calculated. In other implementations, the excitation signal is a voltage, which is applied to the body, and the developed current is measured. In further implementations, the excitation signal is a light source, such as an LED light, and a light sensor is used to measure the returned signal. A light source may be used for measurements of a fluid, such as blood. A light source may also be used for measurements of a gas, such as in a gas meter, or for measurements in the air.

Impedance measurements can be measured using synchronous demodulation. As discussed above, synchronous demodulation involves the use of a demodulation signal chosen to frequency translate the signal used to excite the sensor at the frequency of interest, to a desired, baseband signal. Synchronous demodulation for impedance measurements includes a phase sensitive detector (PSD) or mixer with a reference signal that is frequency locked to the excitation signal. The phase sensitive detector demodulates the received signal, translating the received signal from the excitation frequency to a lower baseband signal. In one example, the lower baseband signal is a DC signal. In some implementations, the mixer (or PSD) is merged with the filter.

The receive path of the synchronous demodulator may also include additional filtering before and/or after the PSD or mixer. When the excitation generation and receive path involve discrete time signal processing, any harmonics in the in the excitation frequency or noise in the sensor/body will be aliased by the sampling if the harmonics are higher than $f_s/2$ (the Nyquist) frequency. Thus, the sampling frequency ($f_s$) is selected such that the aliased harmonics do not fall into the narrow bandwidth of the filter and the mixer. The transfer function spectra for various filters (such as those shown in FIG. 3) and aliasing of harmonics (as shown in FIG. 4) can be used to select a sampling frequency.

Figure 18:
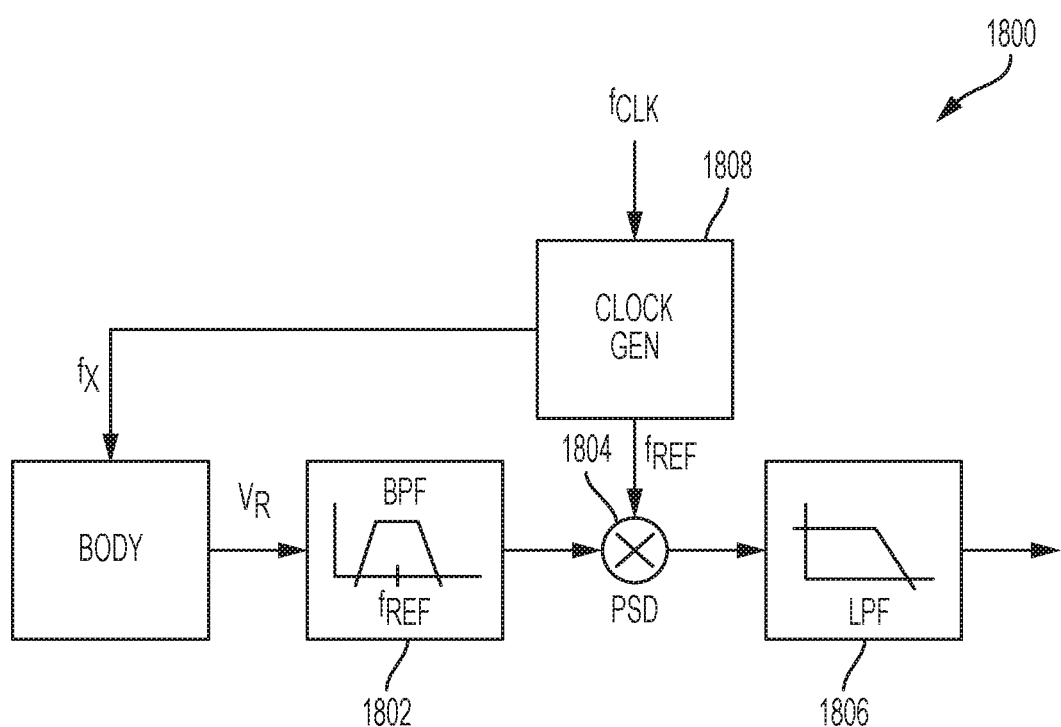
FIG. 18 is a diagram illustrating a synchronous demodulator, according to some embodiments of the disclosure.

FIG. 18 is a diagram illustrating a synchronous demodulator 1800 for measuring body impedance, according to some implementations. The synchronous demodulator 1800 includes a bandpass filter 1802, a mixer 1804, a low pass filter 1806, a clock generator 1808, and a body 1810. The clock generator 1808 generates the excitation signal $f_x$ which is a current forced to flow through the body. The voltage developed across the body is received by the bandpass filter 1802 as the receive signal. The receive signal is band pass filtered at the bandpass filter 1802, and mixed at the mixer 1804 with a reference signal from the clock, generator 1808. The mixed signal is output to the low pass filter 1806, which filters the signal and outputs the body impedance. In some implementations, the mixer 1804 is merged with the bandpass filter 1802. In other examples, the excitation signal $f_x$ is a voltage, and the current developed across the body is received by the bandpass filter 1802 as the receive signal. In some implementations, the BPF 1802 is merged with the mixer 1804.

Figure 19A:
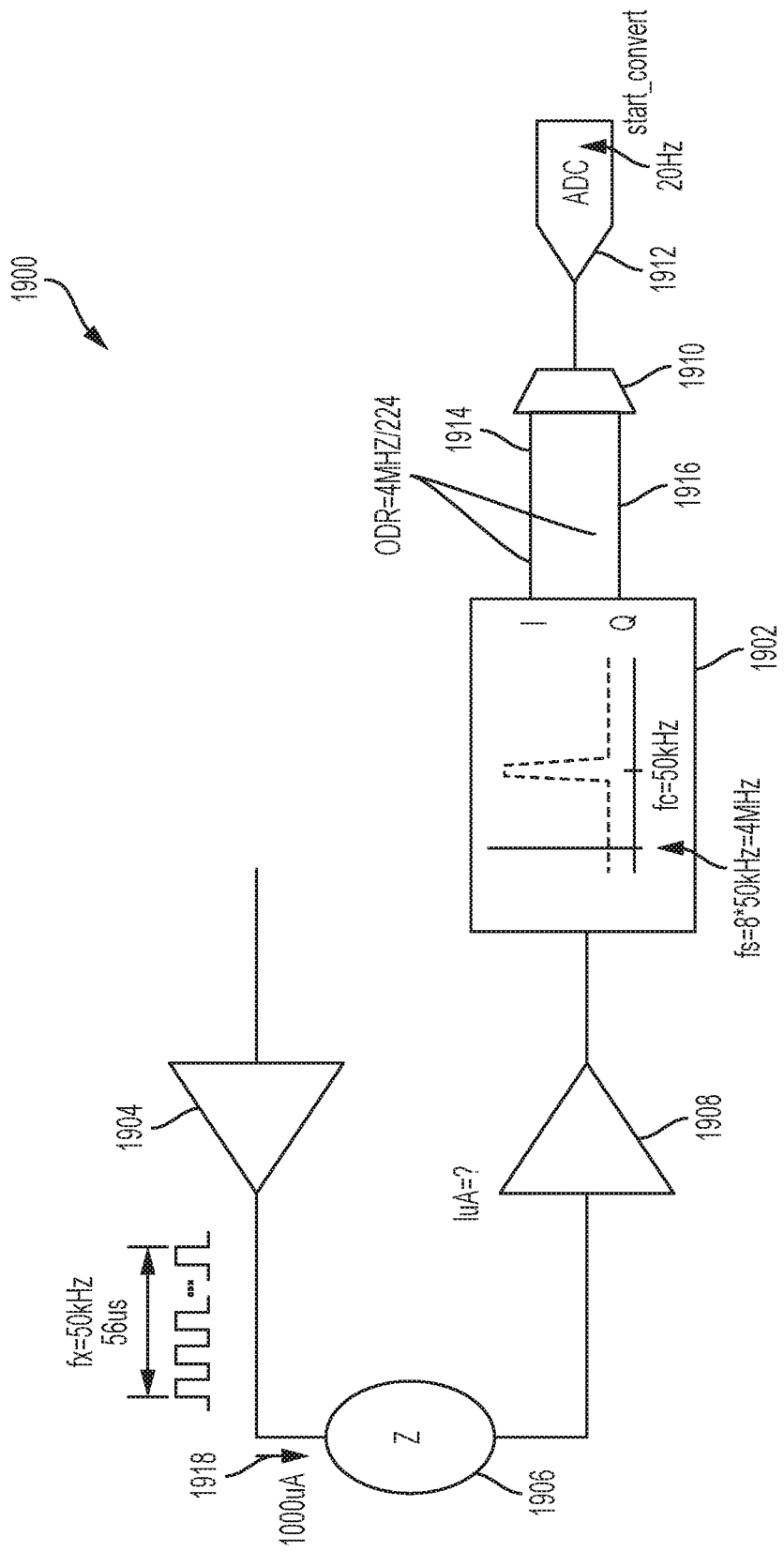
FIGS. 19A-19B are diagrams illustrating low power synchronous demodulator circuits for measuring biophysical impedance, according to some embodiments of the disclosure.

FIG. 19A is a diagram illustrating an ultra-low power synchronous demodulator circuit 1900 for measuring biophysical impedance. The synchronous demodulator circuit 1900 includes a first amplifier 1904, a biophysical impedance element 1906, a second amplifier 1908, a FIR BPF 1902, a multiplexor 1910, and an ADC 1912. An input signal 1918 is passed to the biophysical impedance element 1906. In some examples, the input signal 1918 is a current, and in one example the input signal 1918 current is 1000 µA. The biophysical impedance element 1906 may be a human body or a body part, such as a chest, wrist, neck, leg, head, or other body part. In other examples, the biophysical impedance element 1906 is an animal or a part of an animal. The output from the biophysical impedance element 1906 is input to the second amplifier 1908, where it is amplified and input to the FIR BPF 1902. The FIR BPF 1902 bandpass filters the signal. The FIR BPF 1902 outputs I-data 1914 and Q-data 1916 to a multiplexor 1910. In one example, the FIR BPF 1902 is a 224 tap, 3 µA/Msps, 3V FIR. In one example, the FIR BPF 1902 has a bandpass center frequency $f_c$ of 50 kHz and the sampling rate $f_s=8*f_c=4$ MHz. The I-data and Q-data are input to the multiplexor 1910, which outputs an output data to the ADC 1912. In one example, the ADC 1912 is a 1100 µA/Msps 3V ADC, operating at 20 Hz.

In some implementations, a passive synchronous demodulation circuit such as the circuit 1900 is used, to measure internal thoracic bioimpedance. In one example, the circuit 1900 is a DC system and is used to measure fluid in the lungs and respiratory rate. Respiratory rate is a near DC measurement (<10 Hz). In other examples, the circuit is an AC system and oversamples the bio-impedance measurement at a higher sampling rate. When an AC system oversamples the bio-impedance measurements at a high rate, the frequency-dependent part of the internal impedance parameter is also considered. In many examples, the impedance is substantially constant for frequencies below 50 kHz.

In some implementations, a single DC measurement is made during the center peak lobe of a multiphase excitation waveform. In other implementations, the entire waveform is analyzed. In further implementations, the synchronous demodulator circuit includes a second order Butterworth IIR filter. In some examples, the synchronous demodulator circuit includes an anti-alias filter (AAF).

Figure 19B:
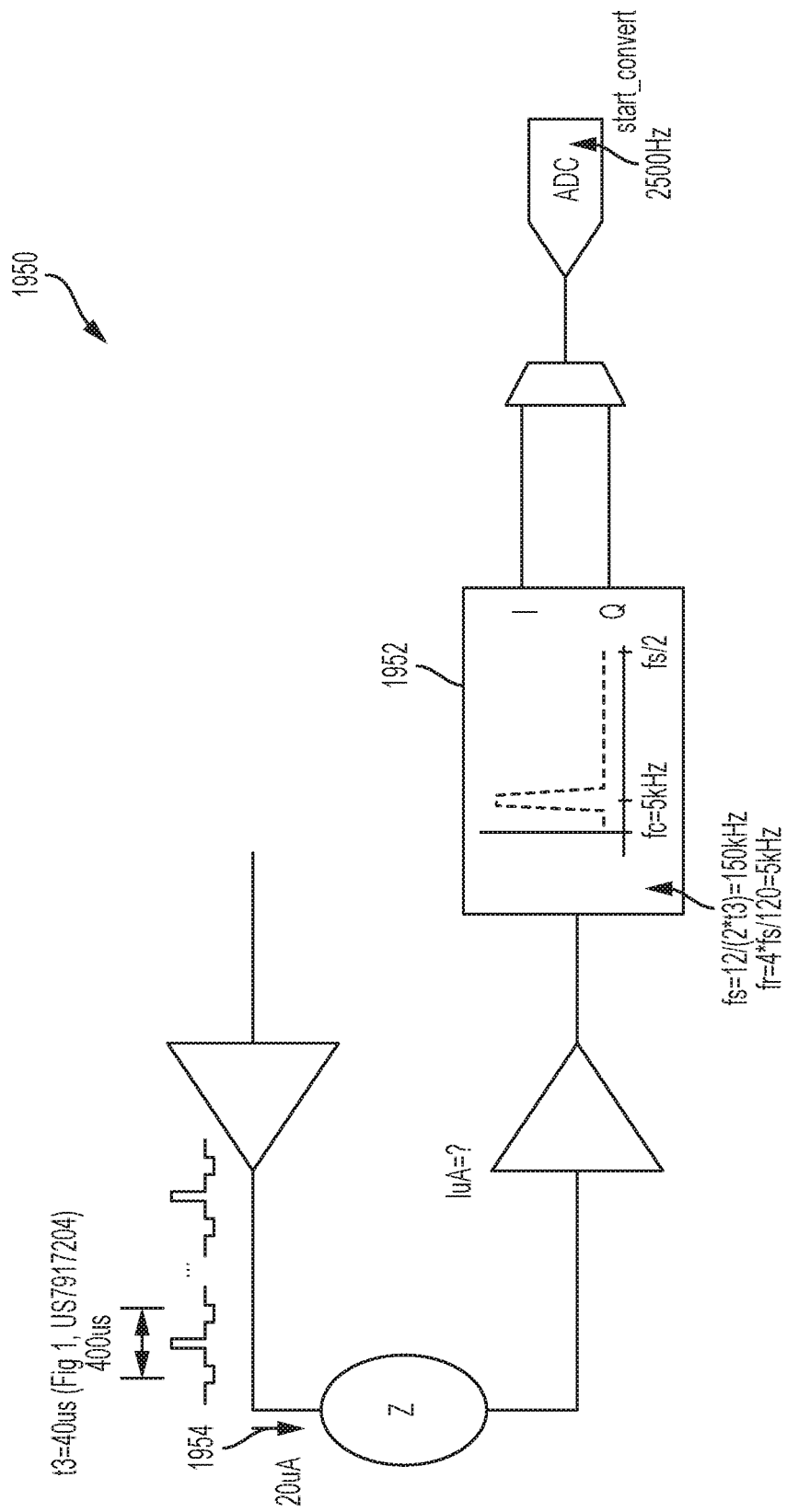
Figure 20:
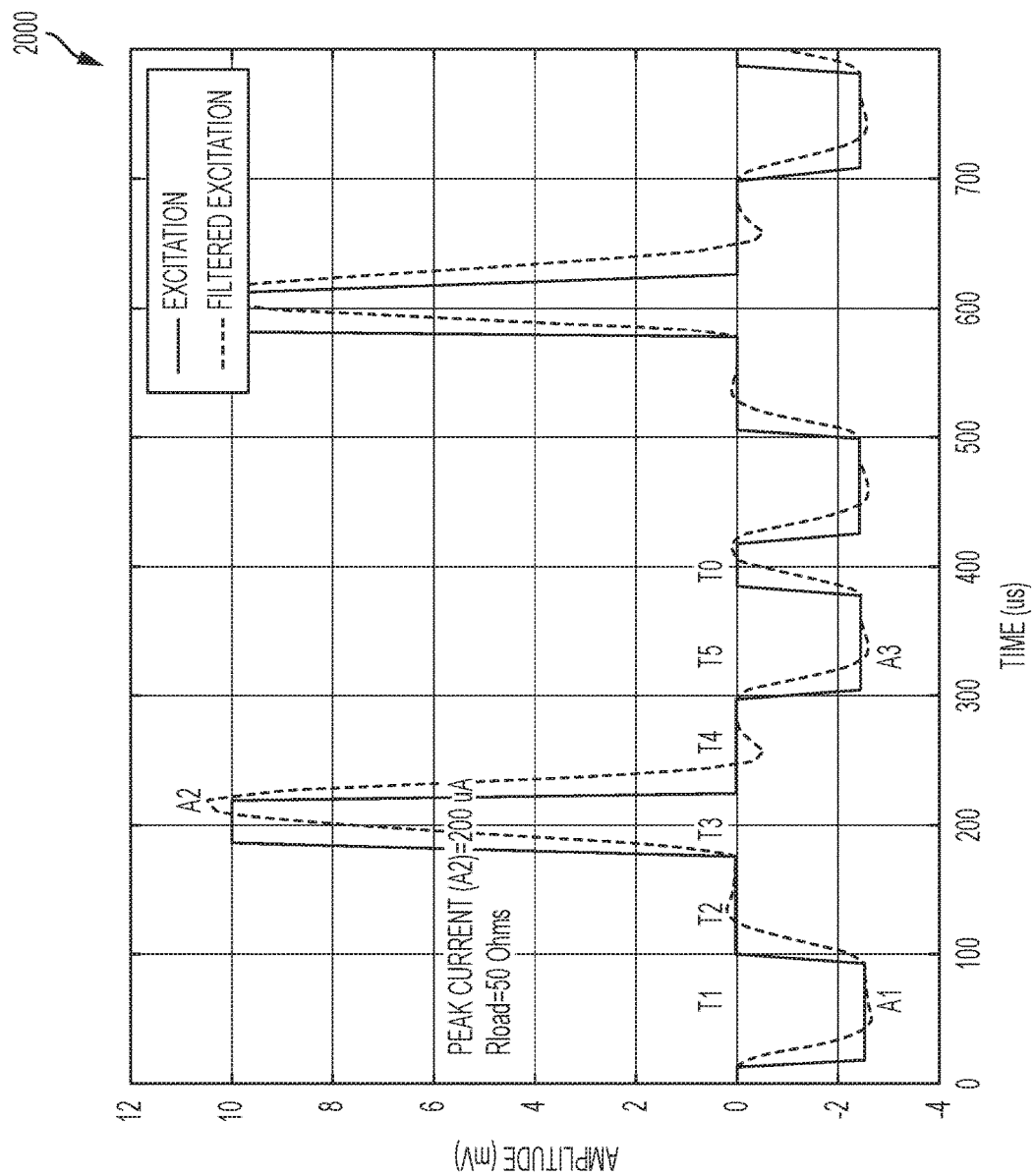
FIG. 20 is a diagram illustrating an input waveform for a synchronous demodulator, according to some embodiments of the disclosure.

FIG. 19B shows a synchronous demodulation circuit 1950 including a FIR BPF 1952 and an input 1954. In one example, the FIR BPF 1952 is a 120 tap FIR having 2 µA/Msps at 3V. In some examples, the center frequency $f_c$ of the FIR BPF 1952 is 5 kHz and the sampling frequency $f_s=150$ kHz and $f_r=5$ kHz $(=4*f_s/120)$. According to one implementation, the input waveform is modeled after the waveform 2000 shown in FIG. 20, and has the following parameters:

| Variable | Value |
|---|---|
| Waveform duration | 400 us |
| Waveform A2 | 200 uA |
| Waveform T1 = T5 | 80 us |
| Waveform T2 = T4 | 80 us |
| Waveform T3 | 40 us |
| Waveform T0 | 20 us |
| Rload | 50 Ohms |

In some implementations, the A2 peak current and the equivalent body impedance have other values. In some examples, one or more internal electrodes are implanted in a patient, and the signals are received from the internal electrodes. In other examples, external electrodes are used. In some implementations, current is output to the electrodes, and a voltage signal is returned from the electrodes. In other implementations, voltage is output to the electrodes and current is returned from the electrodes. The signal-to-noise ratio (SNR) of the signal path is designed to match the conditions of the path. Internal resistance and delta impedance measurements for internal electrodes are generally available. The voltage developed between the internal electrodes can be sampled. For example, the voltage can be sampled on a capacitor. In some examples, voltage can be sampled on a capacitor with a sampled analog bandpass filter as discussed herein. In one example, the circuit 2100 shown in FIG. 21 can be used to sample voltage on a capacitor with a sampled analog bandpass filter. According to various implementations, using the sampled analog method, voltage samples are used directly in a filter and not as a sample-and-hold followed by an ADC.

Figure 21:
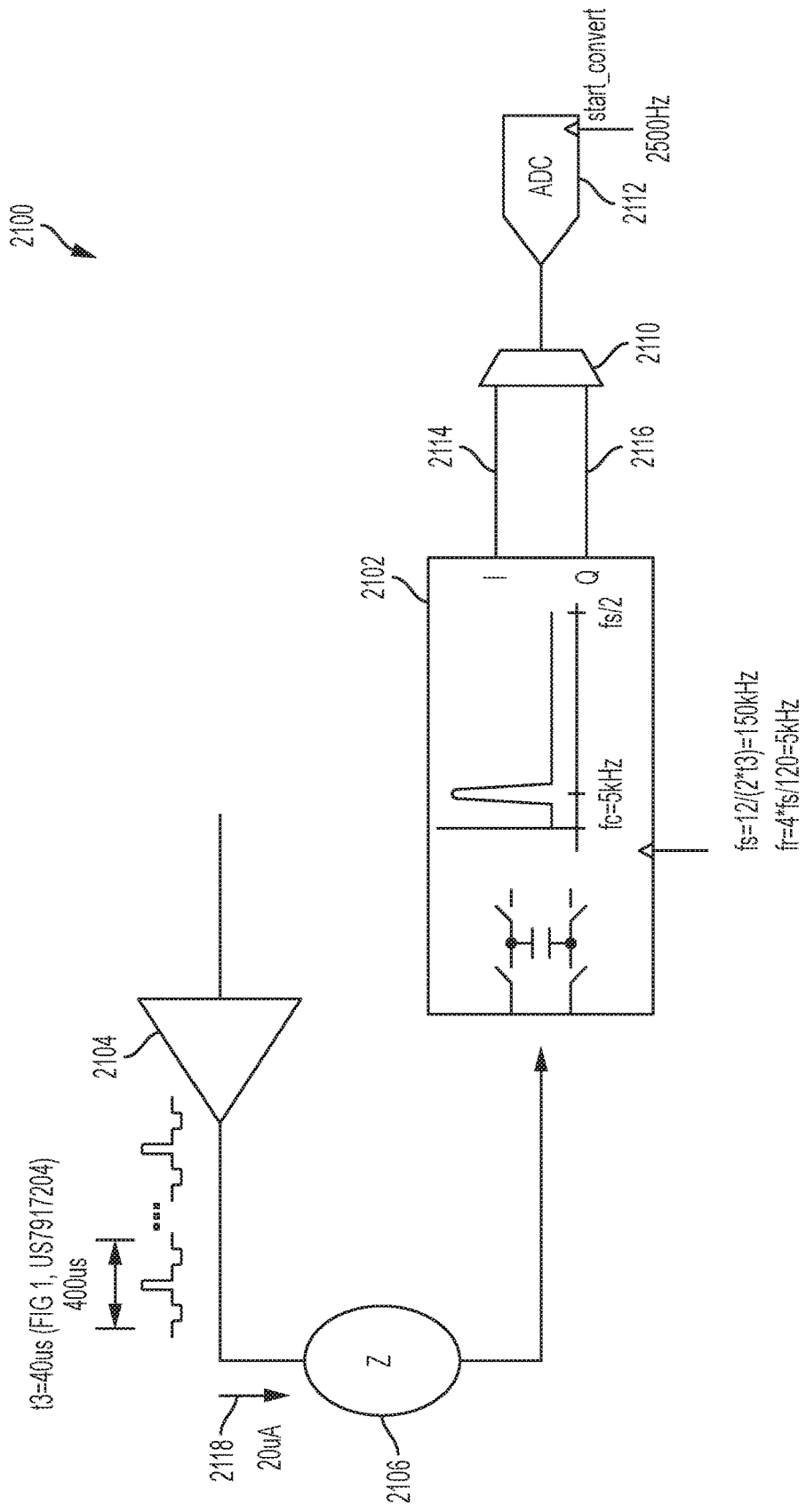
FIG. 21 is a diagram illustrating a synchronous demodulation circuit for measuring biophysical impedance, according to some embodiments of the disclosure.

FIG. 21 is a diagram illustrating a synchronous demodulation circuit 2100 for measuring biophysical impedance, according to some implementations. The synchronous demodulator circuit 2100 includes an amplifier 2104, a biophysical impedance element 2106, a FIR BPF 2102, a multiplexor 2110, and an ADC 2112. An input signal 2118 is passed to the biophysical impedance element 2106. In one example, the input signal 2118 is a 20 µA current. The output from the biophysical impedance element 2106 is input to the FIR BPF 2102, and the FIR BPF 2102 bandpass filters the signal. The FIR BPF 2102 outputs I-data 2114 and Q-data 2116 to a multiplexor 2110. In one example, the FIR BPF 2102 is a 110 tap, 2 µA/Msps, 3V FIR. In one example, the FIR BPF 2102 has a bandpass center frequency $f_c$ of 5 kHz and the sampling rate $f_s=11/(2*t3)=150$ kHz, and the $f_r=4*f_s/110=5$ kHz. The I-data and Q-data are input to the multiplexor 2110, which outputs an output data to the ADC 2112. In one example, the ADC 2112 is a 1000 µA/Msps 3V ADC, operating at 2500 Hz.

The bandpass filter 2102 of FIG. 21 and the bandpass filter 1952 from FIG. 19B are designed with selected filter coefficients. In some implementations, the filter coefficients are constructed by generating an optimized base low pass filter (LPF) and merging a floating point reference carrier waveform with the LPF coefficients to generate I and Q coefficient sets. In one example, the optimized base LPF has the smallest passband for a selected number of taps (Ntap). In another example, the optimized base LPF has stopband rejection. In various implementations, the filter is operated as a block rate filter. The output data rate (ODR) of the filter is equal to the sample rate ($f_s$) divided by the number of taps. After Ntap samples, a single filter output is calculated. Then a second set of samples is collected. The second set of samples may be collected immediately after the first set, or collection of the second set of samples may be delayed by a selected period of time. In various implementations, other filters discussed herein are designed as described above. In some examples, the filters discussed herein may have various output rates and various decimation rates. Additionally, there are many ways to generate the coefficients for the filter other than the examples discussed herein.

Figure 22A:
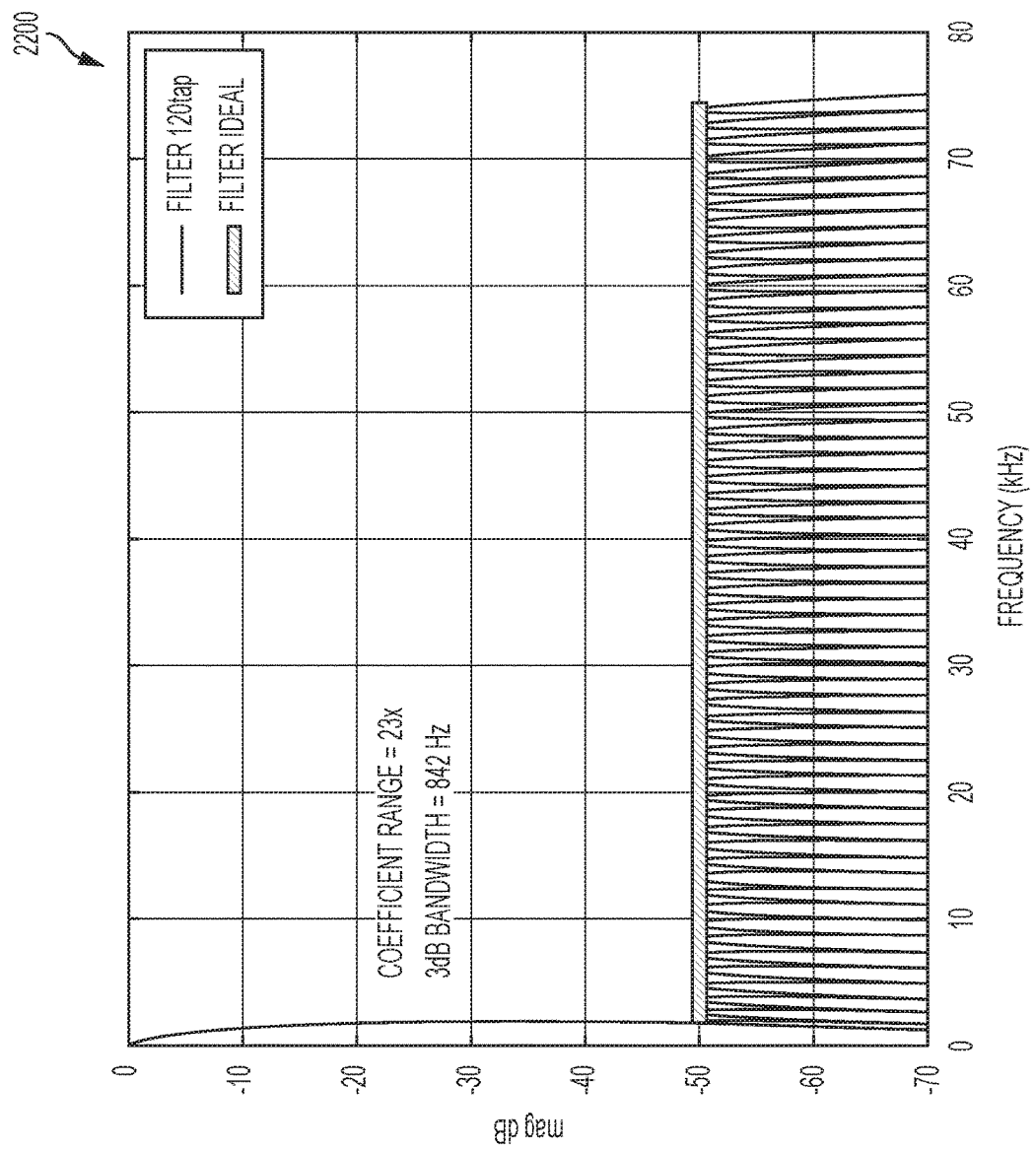
FIGS. 22A and 22B are diagrams illustrating examples of the behavior of a base low pass filter, according to some embodiments of the disclosure.
Figure 22B:
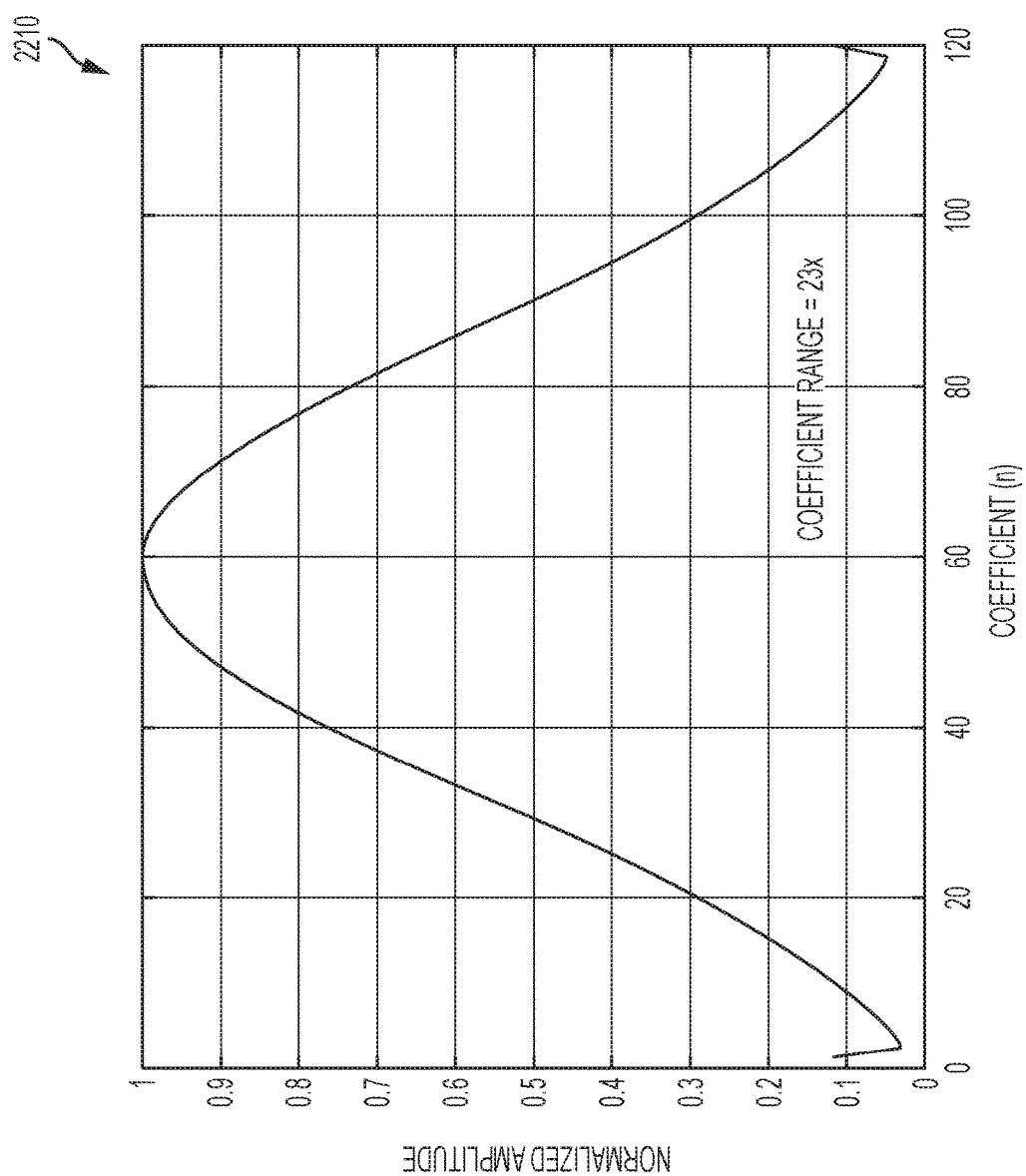

FIGS. 22A-22B are diagrams illustrating examples of the behavior of the base low pass filter described above. FIG. 22A is a diagram 2200 showing the base LPF spectral shape for a LP optimized filter having 120 taps. In one example, the filter has a 3 dB bandwidth which equals 842 Hz, and a coefficient range equal to 23x, which represents the ratio (23) of the largest tap divided by the smallest tap. FIG. 22B is a diagram 2210 showing the normalized amplitude of the base LPF coefficients for a filter having 120 taps and a coefficient range equal to 23x. According to one implementation, the base LPF is designed with a 50 dB stopband rejection. In other implementations, the base LPF is optimized differently by trading off bandwidth and the number of taps.

Figure 23A:
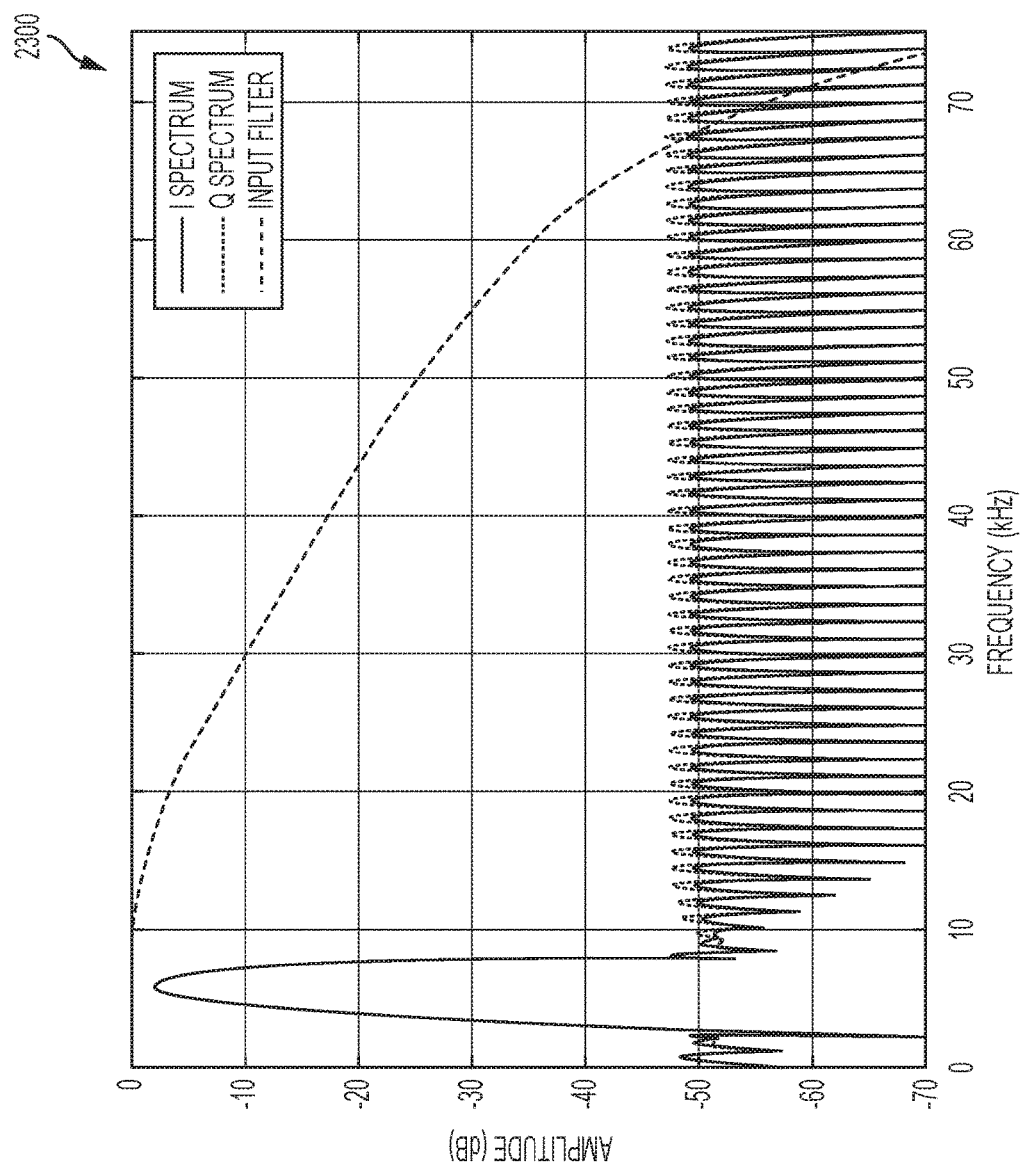
FIGS. 23A-23C are diagrams illustrating the behavior of a filter having a center frequency of 5 kHz, according to some embodiments of the disclosure.
Figure 23B:
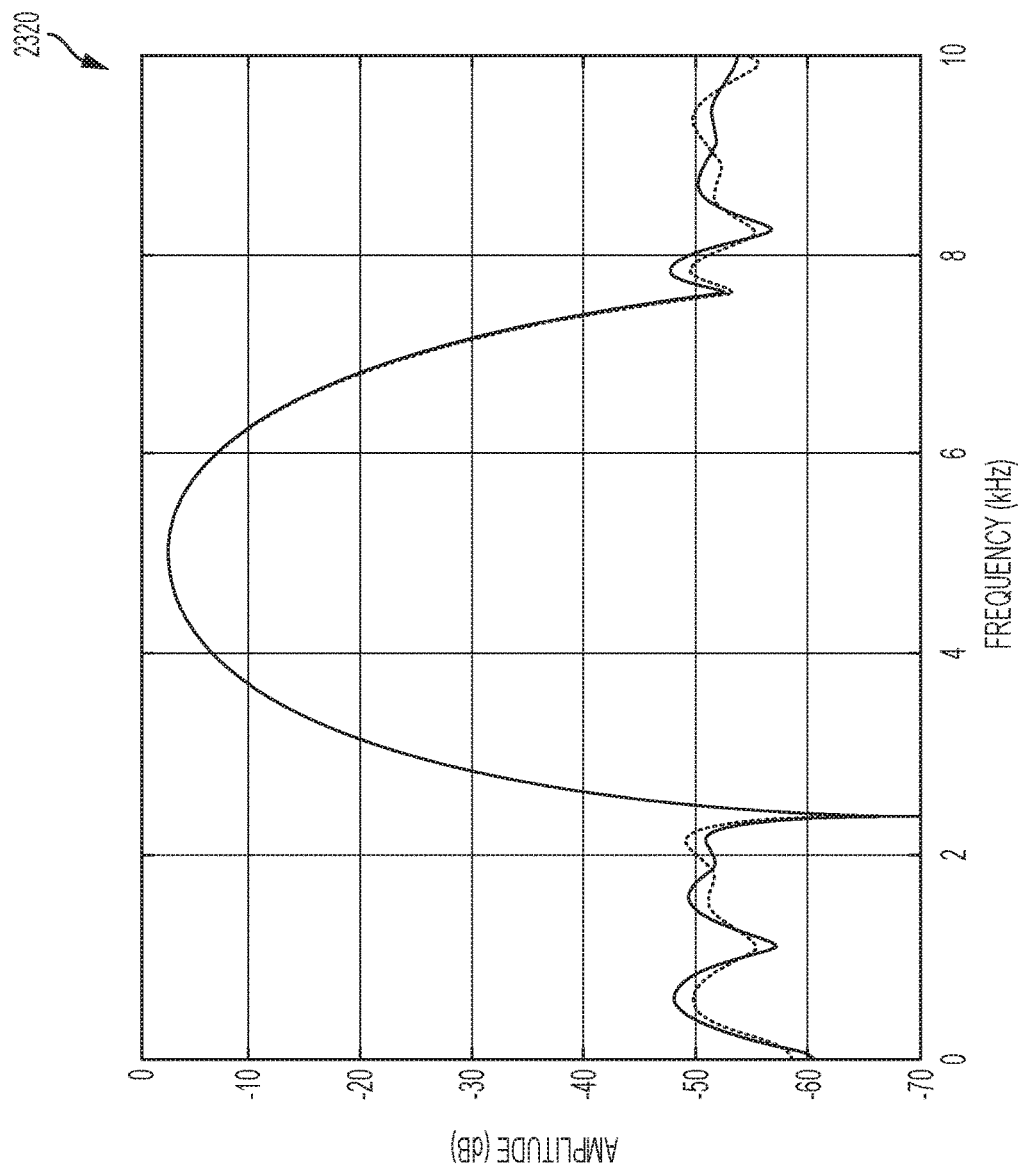
Figure 23C:
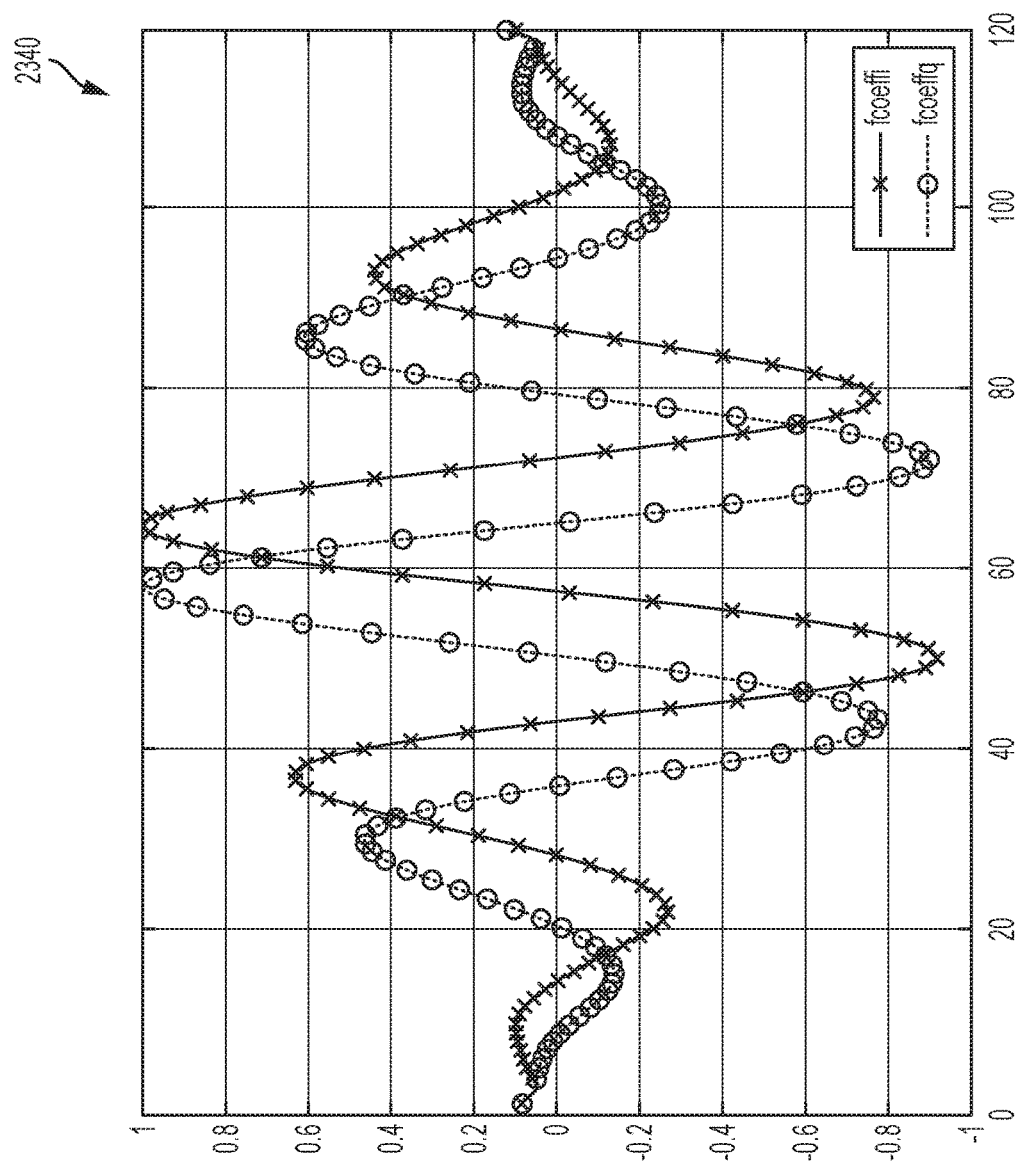

FIG. 23A-23C are diagrams illustrating the behavior of a filter having a center frequency of 5 kHz designed with filter coefficients constructed as described in the two-step process above. In other examples, the center frequency can be any frequency that corresponds to the frequency content of the excitation waveform. FIG. 23A is a diagram 2300 showing the spectral shape of the BPF after merging the floating point reference carrier waveform with the LPF coefficients to generate I and Q coefficient sets as described above. In particular, the diagram 2300 shows the amplitude in dB at frequencies from 0-75 kHz for the I and Q data, and the input filter. FIG. 23B is a diagram 2320 showing the spectral shape as described with respect to FIG. 23A, and focusing on the frequencies from 0-10 kHz. As shown in FIG. 23B, there are first 2324a and second 2324b notches on either side of the center lobe 2322. The first notch 2324a corresponds to the first subharmonic of the tone at 5 kHz and the second notch 2324b corresponds to the second subharmonic of the tone at 5 kHz. The notches are a consequence of the number of taps, and can be optimized. For example, more taps can be added to result in a narrower center lobe. Increasing the number of taps increases the area of the filter and the power consumption of the filter. FIG. 23C is a diagram 2340 showing the I and Q filter coefficients for the bandpass filters. According to various implementations, the output of the filter has a small dynamic range, and in some examples, the output of the filter has about 7-8 bits of dynamic range.

In various implementations, the area of a synchronous demodulation circuit depends on the absolute capacitances used for the coefficients. In some examples, passive switched capacitor circuits are drawn as tiled arrays, in which each tile is a capacitance for a coefficient. The maximum capacitance is defined as the unit capacitance and the coefficients scale from unit capacitance. The size of the unit capacitance also determines the output Vrms thermal noise.

In one example, a passive switched capacitor circuit design includes a unit cap of 400 fF, and the filter is 120 taps long. In this example, the area of the circuit including logic for controlling the switches is about 400 μm×400 μm if all the tiles are the same dimension. The area can be reduced by changing the tile size to reflect the tap value. The output noise is determined by the total capacitance at the summing noise of the filter. In this example, for a 120 tap filter using a 400 fF unit cap, the approximate output noise is 16 uVrms.

In some implementations, the value of unit cap is selected for 7-8 bit dynamic range, and the magnitude output is about 2 mV. This is calculated from I and Q values that have uncorrelated output noise, of 16 uVrms each. Thus, the noise of the magnitude calculation is about sqrt(2)*16 uVrms=22 uVrms. The dynamic range of the I and Q values is 2 mV/16 uVrms or ~125, which is about 7 bits of dynamic range. These values may be further adjusted to account for noise shaping with the bandpass filter spectral shape.

In various implementations, the parameters can be varied to optimize the layout for a larger unit capacitor for the filter, a larger peak excitation current, or other variations in the circuit.

The synchronous demodulator uses much less power and energy than is used in a traditional, digital filter demodulator. Various components to the power estimate include the strobe generator, the excitation power, and the ADC power. The power used by the strobe generator varies based on the design. In one example, using a vector based power calculation of a synthesized design, the strobe generator is about 400 cells of a 2V 180 nm standard cell library, and the total power is about 10 uW/MHz. At $f_s$=150 k, the average continuous strobe power consumption is ~1.6 μW at 2V, or 0.8 μA, for continuous operation with an ODR of 1.25 kHz. Reducing the duty cycle reduces the average current consumption.

The excitation power is partially consumed by the sampling at the input to the filter. In one example, the average current is 40 uA (sum of source and sink) for a peak current of 200 uA. Reducing the duty cycle reduces the average current consumption. In one example, to reduce the average current below 1 uA, the duty cycle is reduced to about 1% or an ODR of 125 Hz.

According to one implementation, the ADC has a current consumption of about 1100 uA/MHz. For the continuous ODR the current is about 3 uA at 2.5 kHz since 2 values have to be multiplexed at the 1.25 kHz rate.

In one example, the ADC conversion rate is 20 Hz to multiplex the I and Q data, and the magnitude is at the 10 Hz rate. Using the 10 Hz rate, the current for each of the components is:

Strobe generator=800 nA at 1.25 kHz=7 nA at 10 Hz
Excitation power=40 uA at 1.25 kHz=320 nA at 10 Hz
ADC power=3 uA at 2.5 kHz=24 nA at 20 Hz Thus, in this example, the total current is about 350 nA for an I and Q output update rate of 10 Hz. In a system with traditional digital filters, the ADC runs at a much higher rate (e.g., 20 kHz) to capture the entire signal before digital filtering.

Frequency Planning
Continuous Time Signal Processing

According to one Implementation, a simple design from a frequency planning perspective involves implementing the PSD as a continuous time multiplier, wherein the reference signal and the excitation signal are sinewaves. In this case the output of the PSD is a signal at the "sum and difference" frequencies. When the excitation signal and the reference signal are the same frequency, the PSD output has just 2 frequency terms, one at dc and the other at $2 \times f_{REF}$. The voltage at the PSD output can be calculated as:

$$V_{PSD}(t) = \frac{2\sqrt{2} \, V_R}{\pi} \cos(f_{REF} \pm f_X \pm \theta_R) = \frac{2\sqrt{2} \, V_R}{\pi}(\cos(\theta_R) + \cos(2f_{REF} - \theta_R))$$

where $V_{PSD}$ is the voltage at the PSD output, $V_R$ is the received voltage, $f_{REF}$ is the frequency of the reference signal, $f_X$ is the frequency of the excitation signal, $\theta_R$ is the relative phase between the reference signal and the receive signal, and $f_{REF}=f_X$.

Generally the signal is passed through a LPF to remove the term at $2f_{REF}$, and the dc term $$\left(\frac{2\sqrt{2} \, V_R}{\pi} \cos(\theta_R)\right)$$

yields the desired answer.

Discrete Time Signal Processing

When the synchronous demodulator is implemented with discrete time signal processing, the frequency planning becomes more complicated. The sampling process introduces "images" in generated signals, and "aliases" in sampled signals. Further, the demodulation process produces "sum and difference" frequency components. Without proper frequency planning, these images, aliases and "sum and difference" terms can interact to cause errors in the measurement.

Some of the frequencies to be considered include:
$f_{CLK}$—the main input clock provided by the user.
$f_S$—frequency of the receive signal sampling.
$f_{SX}$—update frequency of the excitation signal.
$f_{SREF}$—update frequency of the reference signal.
$f_X$—programmable excitation output frequency.
$f_{REF}$—reference signal frequency, locked to $f_X$.

Figure 24:
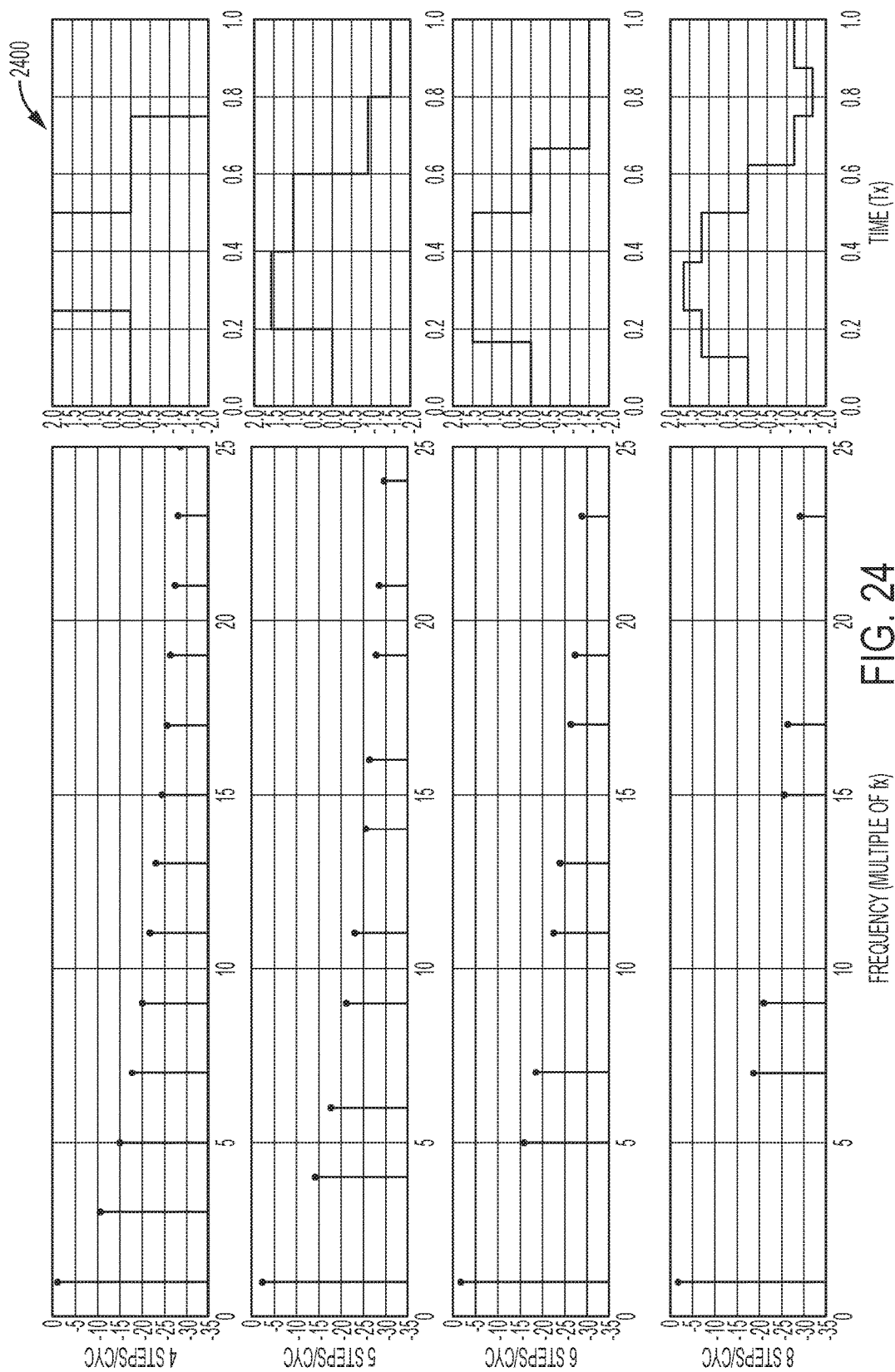
FIG. 24 is a diagram illustrating excitation frequency and time domain diagrams, according to some embodiments of the disclosure.

Generating an excitation signal at $f_X$ with accurate time samples will result in the fundamental at $f_X$, and images at multiples of $f_{SX} \pm f_X$. This is shown pictorially in FIG. 24, which illustrates the excitation frequency and time domain diagrams. The images are attenuated with frequency by the factor sinc(f). Each row of FIG. 24 is the frequency spectrum for a different implementation of $f_x$. The top is a three level (−1, 0, +1) and the bottom is six-level. There are fewer harmonics as the number of levels increases. As the number of levels increases, the time waveform approaches a sinewave. In some implementations, the filter and mixer are merged (for example, FIGS. 12A and 12B), and a sinewave waveform is used. In other implementations the filter and mixer are merged and other selected waveforms are used.

Figure 25:
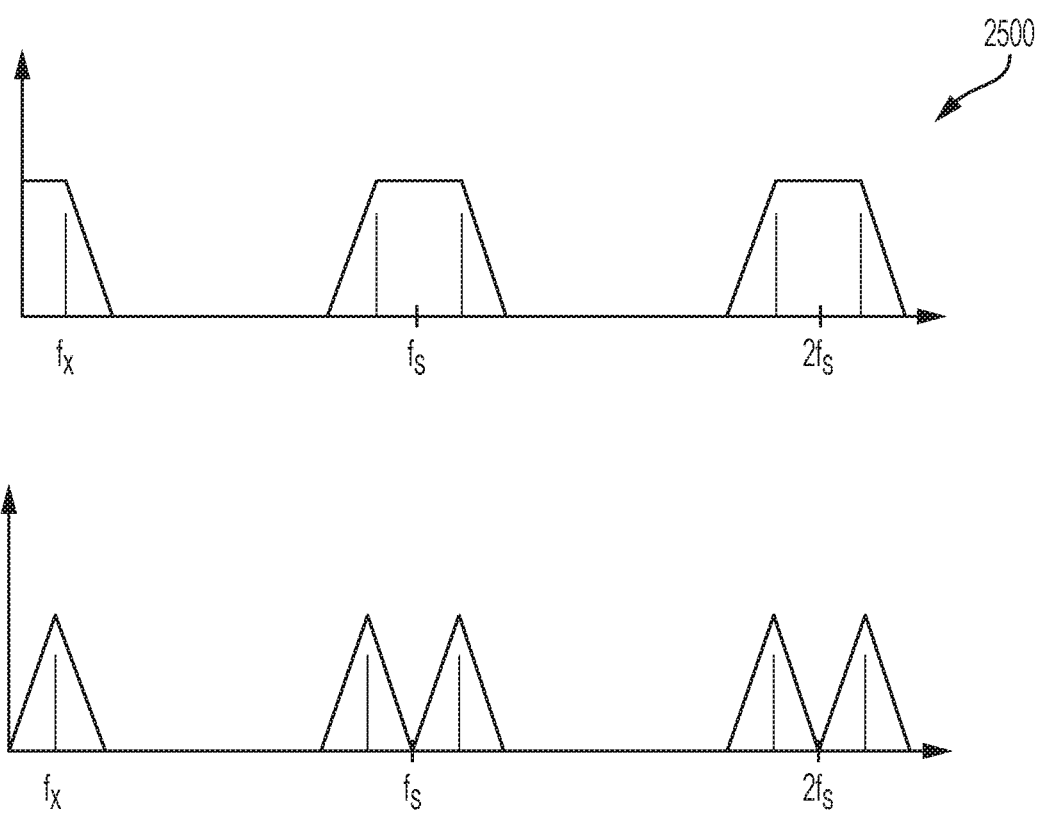
FIG. 25 is a diagram illustrating alias filter passbands, according to some embodiments of the disclosure.

Sampling the receive signal at $f_S$ captures the signal at $f_R(=f_X$ in this example), and additionally, any signals at $f_S \pm f_R$. These additional signals are referred to as aliases, and will be indistinguishable from the desired signal at $f_R$. When a discrete time filter is used on the receive samples, the effective passband for a LPF and BPF can be visualized as in FIG. 24. FIG. 25 is a diagram illustrating alias filter passbands, according to some embodiments of the disclosure.

Figure 26:
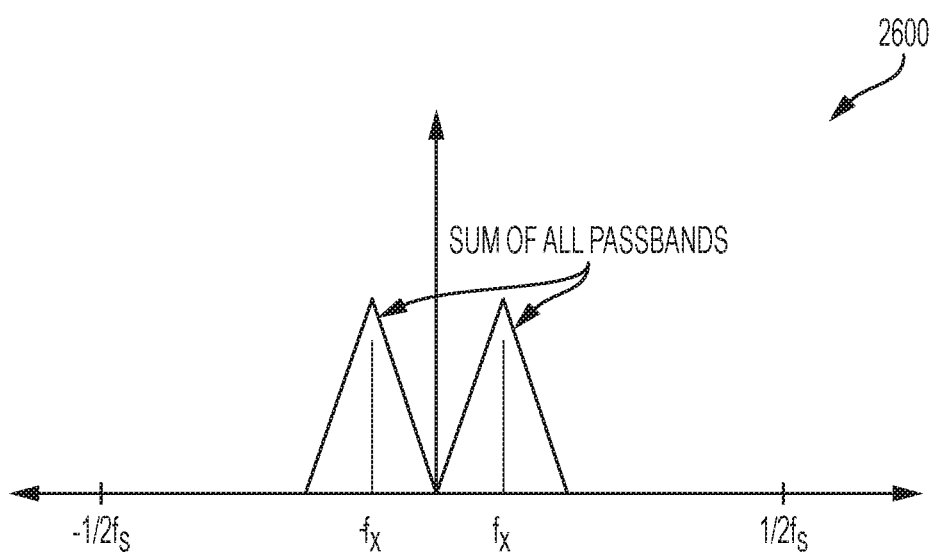
FIG. 26 is a diagram illustrating a filter output, according to some embodiments of the disclosure.

According to one implementation, the discrete passbands at the alias frequencies shown in FIG. 25 are effectively folded back and summed to produce a filter output as shown in FIG. 26. FIG. 26 is a diagram illustrating a filter output, according to some embodiments of the disclosure.

According to one implementation, signals at the alias frequencies are eliminated if possible to avoid causing errors in the measurement of the receive signal.

Finally, demodulation of the filter output occurs and the sum and difference terms are produced at each frequency included in the reference signal.

Overlaying the filer response plot on the excitation signal spectrum shows how the ratio between $f_S$ and $f_{SX}$ can be chosen to minimize interference of the excitation signal harmonics with the fundamental. The spectrum labeled 5 steps/cycle implies $f_{SX}=5f_X$. In this case the filter a LPF response with $f_S=7\ 5/11$ is overlaid. By choosing the sampling frequency to have a modulo with a large denominator factor, higher frequency images falling onto the fundamental frequency are largely avoided. The images, although attenuated by the filter, will appear at the PSD output. In some implementations, the images are removed by the post PSD filter.

Figure 27:
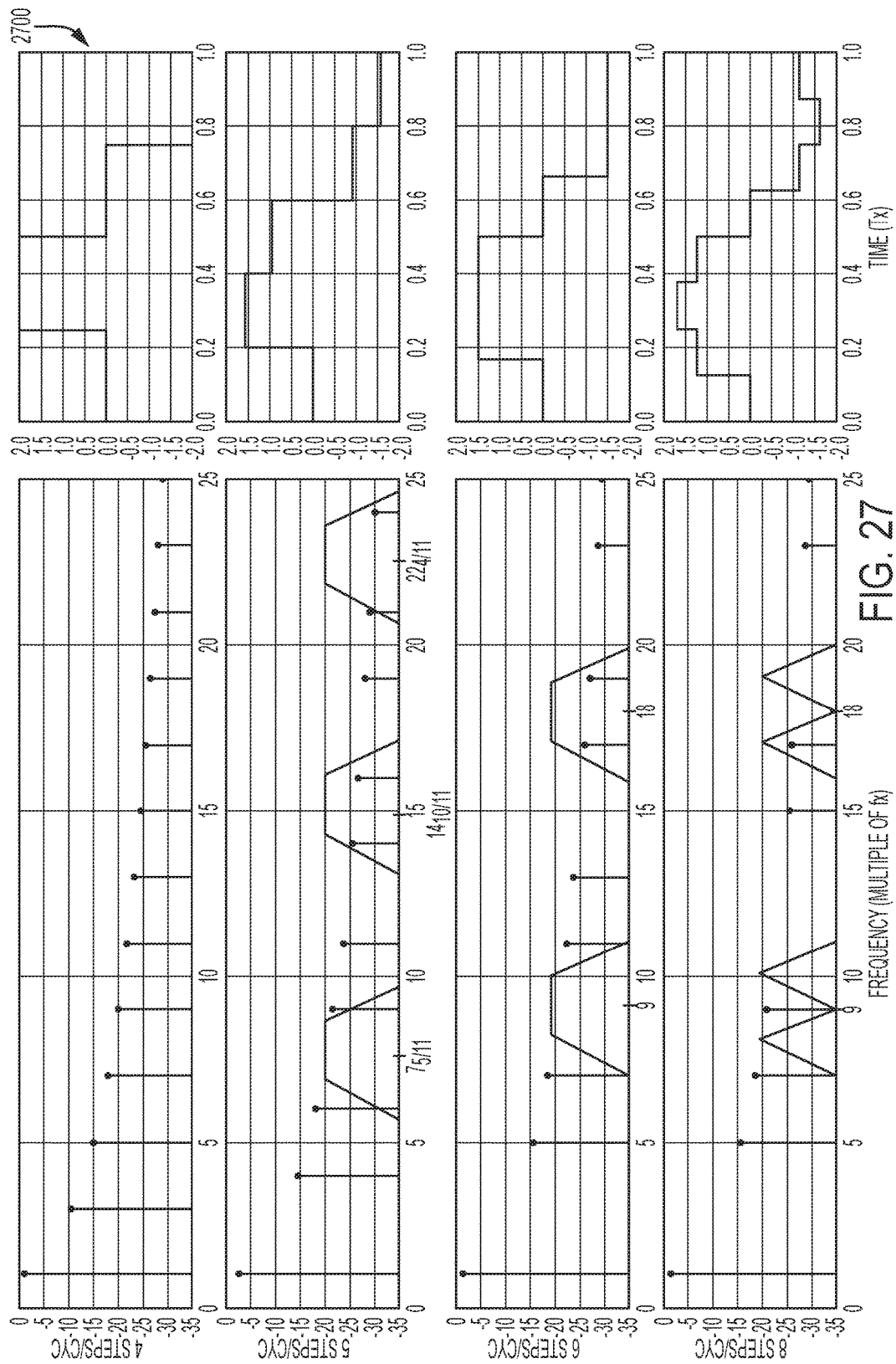
FIG. 27 is a diagram illustrating excitation signals, according to some embodiments of the disclosure.

FIG. 27 is a diagram illustrating excitation signals, according to some embodiments of the disclosure. The spectrum labeled 6 steps/cycle implies $f_{SX}=6f_X$. In this case the filter a LPF response with $f_S=9$ is overlaid. This choice of $f_S$ places the first alias passband in a spectrum where no excitation signal images exist. The second alias passband spectrum does pass the excitation, images at $17f_X$ and $19f_X$, but they are lower in amplitude due to the sinc(f) roll-off and simple anti-image and anti-alias filters can be used to gain further reduction.

The spectrum labeled 8 steps/cycle implies $f_{SX}=8f_X$. In this case the filter a BPF response with $f_S=9$ is overlaid. This choice of $f_S$ places the first alias passband in a spectrum where the BPF eliminates the excitation image. The second alias passband spectrum does pass the excitation images at $17f_X$, but this image is lower in amplitude due to the sinc(f) roll-off and simple anti-image and anti-alias filters can be used to gain further reduction.

Higher sampling frequencies can be chosen that result in reduced level images. For example, with $f_{SX}=8f_X$, $f_S$ can be selected to be $15f_X$. In this case, the first image to pass through a BPF alias would occur at $31f_X$. The higher sampling frequency would come at the cost of higher power consumption.

Variations and Implementations

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the filtering functionalities may be implemented in one or more silicon-cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In various implementations, any of the filter components discussed herein can be programmable coefficients, fixed coefficients, programmable scaling, and/or fixed scaling. For example, fixed scaling may be used in the case of the mixer behavior. Additionally, filters discussed herein can be replaced with other types of filters. For example, a band pass filter may be used in place of a low pass filter or a low pass filter may be used in place of a band pass filter. Similarly, a fixed programmable filter may be used in place of a fixed coefficient filter or a fixed coefficient filter may be used in place of a programmable filter.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance, systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications, can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to filters, illustrate only some of the possible filter functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for"

or "step for" are specifically used in the particular claims; and (b) does not intend, by any statement in the specification, to limit this disclosure in any way that is not otherwise reflected in the appended claims.

Other Notes, Examples, and Implementations

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A system for synchronous demodulation using passive sampled analog filtering, comprising:
   an input channel for receiving an input signal;
   a first passive sampled analog filter for sampling and filtering the input signal;
   a mixer for mixing the filtered input signal from the first filter and outputting a mixed signal;
   a second passive sampled analog filter for filtering the mixed signal; and
   an output channel for outputting the filtered mixed signal.

2. The system of claim 1, wherein the first filter and the mixer are combined in a single passive circuit block.

3. The system of claim 1, further comprising a first active amplifier between the first filter and the mixer for amplifying the filtered signal.

4. The system of claim 3, further comprising a second active amplifier between the mixer and the second filter for amplifying the mixed signal.

5. The system of claim 1, wherein the first passive sampled analog filter is a programmable filter.

6. The system of claim 1, wherein the first passive sampled analog filter is one of a low-pass filter, a band-pass filter, a high-pass filter, and a filter with an arbitrary filter shape.

7. The system of claim 1, wherein the first passive analog filter is one of a FIR filter and an IIR filter.

8. The system of claim 1, wherein the second passive sampled analog filter is a low pass filter.

9. The system of claim 1, further comprising a clock generator for generating an excitation signal, and wherein the excitation signal is modified by a target element, and the modified excitation signal is the input signal.

10. The system of claim 9, wherein the target element is a body part and wherein the system measures bioimpedance of the body part.

11. The system of claim 9, wherein the clock generator generates a reference signal, and wherein the reference signal is mixed with the filtered input signal at the mixer.

12. The system of claim 9, wherein the target element is one of a sensor and a transformer.

13. A method for synchronous demodulation using passive sampled analog filtering, comprising:
   presenting an excitation signal to a target element;
   receiving, at an input, a modified signal from the target element;
   sampling and filtering, using a passive sampled analog filter, the modified signal to remove noise;
   mixing the filtered signal with a reference signal from a clock generator;
   filtering, using a second passive sampled analog filter, the mixed signal; and
   outputting, from the second passive sampled analog filter, a signal representing characteristics of the target element.

14. The method of claim 13, wherein presenting the excitation signal includes presenting a current to the target element, and wherein receiving a modified signal includes receiving a voltage.

15. The method of claim 13, wherein presenting the excitation signal includes presenting a voltage to the target element, and wherein receiving a modified signal includes receiving a current.

16. The method of claim 13, wherein outputting the signal includes outputting an I-component of the signal and outputting a Q-component of the signal.

17. A synchronous demodulation system using passive sampled analog filtering, comprising:
   a clock generator for generating an excitation signal;
   an input channel for receiving a modified excitation signal;
   means for passively sampling, filtering and mixing the modified excitation signal to synchronously demodulate the modified excitation signal and generate a demodulated output signal.

18. The system of claim 17, wherein the means for passively filtering the modified excitation signal includes a passive sampled analog filter.

19. The system of claim 18, wherein the passive sampled analog filter is one of a low-pass filter, a band-pass filter, a high-pass filter, and a filter with an arbitrary filter shape.

20. The system of claim 17, wherein the means for mixing the modified excitation signal include a mixer, and wherein the mixer is one of a two-level mixer, a three-level mixer, and a mixer with greater than three levels.

* * * * *